US012610803B2

(12) United States Patent
Su

(10) Patent No.: US 12,610,803 B2
(45) Date of Patent: Apr. 21, 2026

(54) SEMICONDUCTOR DEVICE STRUCTURE WITH REDUCED CRITICAL DIMENSION AND METHOD FOR PREPARING THE SAME

(71) Applicant: NANYA TECHNOLOGY CORPORATION, New Taipei City (TW)

(72) Inventor: Kuo-Hui Su, Taipei City (TW)

(73) Assignee: NANYA TECHNOLOGY CORPORATION, New Taipei City (TW)

( * ) Notice: Subject to any disclaimer, the term of this patent is extended or adjusted under 35 U.S.C. 154(b) by 371 days.

(21) Appl. No.: 18/380,312

(22) Filed: Oct. 16, 2023

(65) Prior Publication Data

US 2025/0125190 A1 Apr. 17, 2025

(51) Int. Cl.
*H10W 20/00* (2026.01)
*H10D 62/40* (2025.01)
(Continued)

(52) U.S. Cl.
CPC ........ *H10W 20/089* (2026.01); *H10D 62/402* (2025.01); *H10D 62/83* (2025.01); *H10P 14/416* (2026.01); *H10P 14/6308* (2026.01)

(58) Field of Classification Search
CPC .............. H01L 21/033; H01L 21/0337; H01L 21/3205; H01L 21/32055; H01L 21/321;
(Continued)

(56) References Cited

U.S. PATENT DOCUMENTS

2022/0148970 A1* 5/2022 Su ..................... H01L 21/76846
2022/0181261 A1* 6/2022 Huang ................ H01L 23/5329

FOREIGN PATENT DOCUMENTS

TW 202220147 A 5/2022

OTHER PUBLICATIONS

Office Action and search report mailed on Jun. 21, 2024 related to Taiwanese Application No. 112149018.
(Continued)

*Primary Examiner* — Brook Kebede
(74) *Attorney, Agent, or Firm* — Xuan Zhang

(57) ABSTRACT

The present disclosure provides a semiconductor device structure and a method for preparing the semiconductor device structure. The semiconductor device structure includes a first conductive layer disposed over a semiconductor substrate; a first dielectric layer disposed over the first conductive layer; an energy-removable layer conformally deposited over the first dielectric layer in a pattern-dense region; a patterned mask disposed over the first dielectric layer and the energy-removable layer, wherein the patterned mask includes a first pattern disposed in the pattern-dense region, a second pattern disposed over a sidewall of the first pattern, and a third pattern disposed in a pattern-loose region; and a plurality of processed areas disposed on a top surface of the energy-removable layer and between two adjacent first patterns and also disposed on the first pattern. A second critical dimension of the second pattern is smaller than a first critical dimension of the first pattern.

12 Claims, 23 Drawing Sheets

(51) Int. Cl.
  *H10D 62/83*   (2025.01)
  *H10P 14/40*   (2026.01)
  *H10P 14/60*   (2026.01)

(58) Field of Classification Search
  CPC ............. H01L 21/32105; H01L 21/768; H01L
       21/76816; H01L 21/7682; H01L
      21/76885; H01L 23/528; H10B 12/00;
    H10B 12/02; H10B 12/30; H10B 12/48;
      H10B 12/485; H10D 62/40; H10D
     62/402; H10D 62/83; G06F 30/00; H10P
      14/40; H10P 76/4085; H10P 14/416;
      H10P 14/60; H10P 14/6308; H10W
     20/00; H10W 20/063; H10W 20/072;
       H10W 20/089; H10W 20/46
  See application file for complete search history.

(56)      References Cited

OTHER PUBLICATIONS

Office Action and search report mailed on Jul. 3, 2024 related to Taiwanese Application No. 113117133.

* cited by examiner

10 ⟶

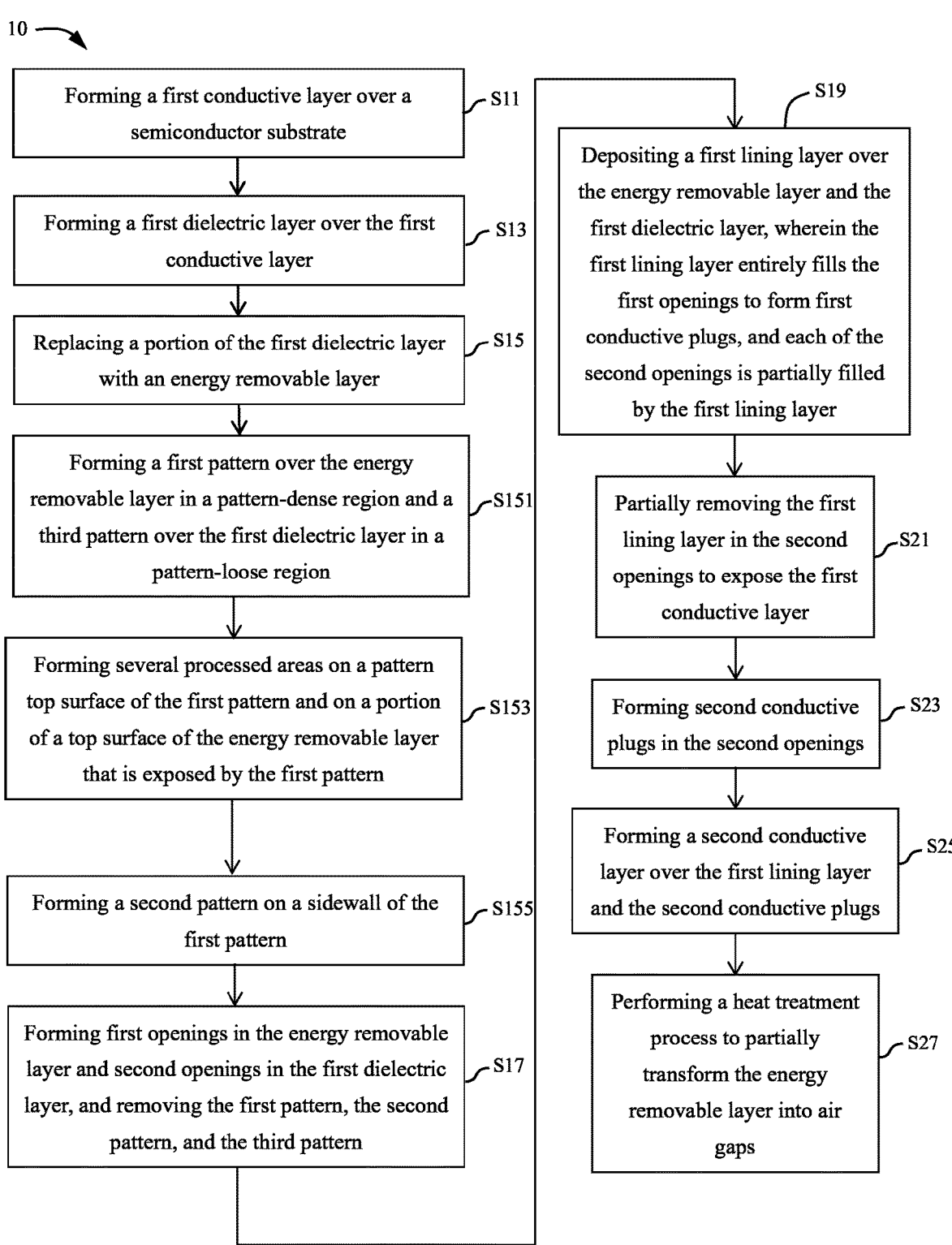

Forming a first conductive layer over a semiconductor substrate — S11

Forming a first dielectric layer over the first conductive layer — S13

Replacing a portion of the first dielectric layer with an energy removable layer — S15

Forming a first pattern over the energy removable layer in a pattern-dense region and a third pattern over the first dielectric layer in a pattern-loose region — S151

Forming several processed areas on a pattern top surface of the first pattern and on a portion of a top surface of the energy removable layer that is exposed by the first pattern — S153

Forming a second pattern on a sidewall of the first pattern — S155

Forming first openings in the energy removable layer and second openings in the first dielectric layer, and removing the first pattern, the second pattern, and the third pattern — S17

S19

Depositing a first lining layer over the energy removable layer and the first dielectric layer, wherein the first lining layer entirely fills the first openings to form first conductive plugs, and each of the second openings is partially filled by the first lining layer Partially removing the first lining layer in the second openings to expose the first conductive layer — S21

Forming second conductive plugs in the second openings — S23

Forming a second conductive layer over the first lining layer and the second conductive plugs — S25

Performing a heat treatment process to partially transform the energy removable layer into air gaps — S27

SEMICONDUCTOR DEVICE STRUCTURE WITH REDUCED CRITICAL DIMENSION AND METHOD FOR PREPARING THE SAME

TECHNICAL FIELD

The present disclosure relates to a semiconductor device structure and a method for preparing the same, and more particularly, to a semiconductor device structure with a reduced critical dimension and a method for preparing the same.

DISCUSSION OF THE BACKGROUND

Semiconductor devices are essential for many modern applications. With the advancement of electronic technology, semiconductor devices are becoming smaller in size while providing greater functionality and including greater amounts of integrated circuitry. Due to the miniaturized scale of semiconductor devices, various types and dimensions of semiconductor devices providing different functionalities are integrated and packaged into a single module. Furthermore, numerous manufacturing operations are implemented for integration of various types of semiconductor devices.

Reducing the size of integrated circuits (ICs) results in improved performance, increased capacity, and/or reduced cost. Each size reduction requires more sophisticated techniques to form the ICs. Photolithography is commonly used to pattern ICs on a substrate. An exemplary feature of an IC is a line of a material which may be a metal, a semiconductor, or an insulator. Line width is the width of the line and spacing is the distance between adjacent lines. Pitch is defined as the distance between a same point on two adjacent lines. The pitch is equal to the sum of the line width and the spacing. However, due to factors such as optics and light or radiation wavelength, photolithography techniques have a minimum pitch, below which a particular photolithographic technique may not reliably form features. Thus, the minimum pitch of a photolithographic technique can limit feature size reduction. Similarly, patterning tools designed to create vias or line interconnects 100 nm or wider are not commonly able to create smaller vias. Therefore, as device sizes are reduced to these small dimensions, current lithography processes are challenged to create patterns with the required critical dimensions (CD).

Currently, conformal layers used to reduce critical dimensions, such as a reduced-dimension pattern in a hardmask, are formed by atomic layer deposition (ALD) using an etchable material such as silicon oxide. However, quality of the deposited material can be difficult to control, resulting in low density, poor mechanical strength, and reduced resistance to subsequent etching chemistries. High stresses in ALD oxides can also lead to buckling and deformation of underlayers, as well as delamination due to poor adhesion and insufficient chemical compatibility. Additionally, oxide materials require a wet-clean process for removal after etching. Wet cleaning is an isotropic process which typically leads to CD loss and undercut issues. To avoid having to redesign the current lithography tools, new methods are needed to reduce the critical dimension of IC lines and via interconnects etched into a substrate.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

In one embodiment of the present disclosure, a semiconductor device is provided. The semiconductor device includes a first conductive layer disposed over a semiconductor substrate; a first dielectric layer disposed over the first conductive layer; an energy-removable layer conformally deposited over the first dielectric layer in a pattern-dense region, wherein a top surface of the energy-removable layer is substantially coplanar with a top surface of the first dielectric layer; a patterned mask disposed over the first dielectric layer and the energy-removable layer, wherein the patterned mask includes a first pattern, a second pattern and a third pattern, wherein the first pattern is disposed in the pattern-dense region, the second pattern is disposed over a sidewall of the first pattern, and the third pattern is disposed in a pattern-loose region; and a plurality of processed areas disposed on the top surface of the energy-removable layer and between two adjacent first patterns and also disposed on a pattern top surface of the first pattern.

In an embodiment, the first pattern has a first critical dimension and the second pattern has a second critical dimension, wherein the second critical dimension is smaller than the first critical dimension. In an embodiment, a material of the first pattern is silicon, which is either amorphous silicon or polysilicon. In an embodiment, the second pattern is silicon oxide. In an embodiment, a material of the first pattern is same as a material of the third pattern.

In an embodiment, the second pattern is formed by non-photolithographic techniques. In an embodiment, the second pattern is formed by thermal oxidation.

In another embodiment of the present disclosure, a semiconductor device is provided. The semiconductor device includes a first conductive layer disposed over a semiconductor substrate; an energy-removable layer deposited over the first conductive layer; a plurality of first patterns individually disposed over the energy-removable layer; a plurality of second patterns disposed over sidewalls of each of the first patterns; and a plurality of processed areas disposed on a top surface of the energy-removable layer and between two adjacent first patterns and also disposed on a pattern top surface of each of the first patterns.

In an embodiment, each of the first patterns has a first critical dimension and each of the second patterns has a second critical dimension, wherein the second critical dimension is smaller than the first critical dimension. In an embodiment, a material of each of the first patterns is silicon, which is either amorphous silicon or polysilicon. In an embodiment, each of the second patterns is silicon oxide.

In an embodiment, the second patterns are formed by non-photolithographic techniques. In an embodiment, the second patterns are formed by thermal oxidation.

In yet another embodiment of the present disclosure, a method for preparing a semiconductor device structure is provided. The method includes forming a first conductive layer over a semiconductor substrate; forming a first dielectric layer over the first conductive layer; replacing a portion of the first dielectric layer with an energy-removable layer; forming a first pattern over the energy-removable layer, wherein the first pattern has a first critical dimension; forming a plurality of processed areas on a pattern top surface of the first pattern and on a portion of a top surface of the energy-removable layer that is exposed by the first pattern; and forming a second pattern on sidewalls of the first pattern but outside of the processed areas, wherein the second pattern has a second critical dimension that is smaller than the first critical dimension.

In an embodiment, a material of the first pattern is silicon, which is either amorphous silicon or polysilicon. In an embodiment, a material of the second pattern is silicon oxide. In an embodiment, the second pattern is formed by non-photolithographic techniques. In an embodiment, the second pattern is formed by thermal oxidation. In an embodiment, the method further comprises forming a third pattern over the first dielectric layer while forming the first pattern. In an embodiment, the first pattern is formed in a pattern-dense region and the third pattern is formed in a pattern-loose region. In an embodiment, the method further comprises performing an etching process to form a first opening in the energy-removable layer and a second opening in the first dielectric layer, wherein the first opening is in the pattern-dense region and the second opening is in the pattern-loose region. In an embodiment, a patterned mask is composed of the first pattern, the second pattern and the third pattern, wherein after the first opening and the second opening are formed, the patterned mask is removed. In an embodiment, the first opening has a first width defined as a topmost width of the first opening, and the second opening has a second width defined as a topmost width of the second opening, wherein the second width is greater than the first width. In an embodiment, the method further comprises depositing a first lining layer over the energy-removable layer and the dielectric layer, wherein the first lining layer entirely fills the first opening to form a first conductive plug, and the first lining layer partially fills the second opening after the removal of the patterned mask. In an embodiment, the first lining layer and the first conductive plug are integrally formed, and the first lining layer and the first conductive plug are made of the same material. In an embodiment, the first lining layer and the first conductive plug are made of a manganese-containing material. In an embodiment, the first lining layer and the first conductive plug is made of copper manganese.

In an embodiment, the method further comprises forming a second conductive plug in a remaining portion of the second opening. In an embodiment, the method further comprises forming a second conductive layer over the first lining layer and the second conductive plug. In an embodiment, the etching process further forms a third opening in the pattern-dense region and adjacent to the first opening, and a fourth opening in the pattern-loose region and adjacent to the second opening, wherein the third opening has a third width defined as a topmost width of the third opening, the fourth opening has a fourth width defined as a topmost width of the fourth opening, and the fourth width is greater than the third width. In an embodiment, the fourth opening in the pattern-loose region is wider than the third opening in the pattern-dense region. In an embodiment, the first conductive plug is made of copper manganese (CuMn), and the second conductive plug is made of copper (Cu). In an embodiment, the method further comprises partially removing the lining layer in the second opening to expose the first conductive layer before the second conductive plug is formed. In an embodiment, the second conductive plug and the second conductive layer are formed simultaneously in a same process step. In an embodiment, the method further comprises performing a heat treatment process to partially transform the energy-removable layer into an air gap after the second conductive layer is formed.

Embodiments of a semiconductor device structure and a method for preparing the same are provided in the disclosure. The pattern top surface and the top surface exposed by the first pattern are processed (e.g., damaged by ion implantation) so the second pattern is selectively formed only on the sidewall of the first pattern, excluding the processed areas. Thus, the second pattern reduces gaps between the features of the first pattern. That is, the first pattern and the second pattern combine to form a new pattern with a smaller gap. The resultant combined pattern of the semiconductor structure therefore has a smaller critical dimension than the original first pattern. Since the second pattern can be formed by a process well-known in the art, such as thermal oxidation, the methods and structures disclosed in the present disclosure can dramatically reduce the critical dimension of a pattern without requiring new techniques or tools, which can be very expensive and problematic. Thus, by using the methods and structures provided by the present disclosure, ICs can be manufactured with features of reduced sizes without drastically increasing cost.

In some embodiments, the semiconductor device structure includes a first conductive plug penetrating through a dielectric layer in a pattern-dense region, a lining layer covering the dielectric layer and the first conductive plug, and a second conductive plug penetrating through the lining layer and the dielectric layer in a pattern-loose region. The lining layer and the first conductive plug include manganese, and the second conductive plug is separated from the dielectric layer by the lining layer. The manganese-containing conductive plug (i.e., the first conductive plug in the pattern-dense region) and the lining layer may be integrally formed, thereby reducing manufacturing cost. Moreover, the lining layer may reduce or prevent voids from forming in the subsequently-formed conductive plug (i.e., the second conductive plug in the pattern-loose region), thereby decreasing contact resistance. As a result, an operation speed of the semiconductor device structure may be increased, which significantly improves overall device performance.

The foregoing has outlined rather broadly the features and technical advantages of the present disclosure in order that the detailed description of the disclosure that follows may be better understood. Additional features and advantages of the disclosure are described hereinafter, and form the subject of the claims of the disclosure. It should be appreciated by those skilled in the art that the conception and specific embodiments disclosed herein may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIG. 2 is a flow diagram illustrating a method for preparing a semiconductor device structure, in accordance with some embodiments.

FIG. 7A is a cross-sectional view illustrating an intermediate stage of forming a first pattern over the energy-removable layer and the first dielectric layer during the formation of the semiconductor device structure, in accordance with some embodiments.

FIG. 7B is a cross-sectional view illustrating an intermediate stage of forming processed areas over the first pattern and the energy-removable layer during the formation of the semiconductor device structure, in accordance with some embodiments.

DETAILED DESCRIPTION

Figure 1:
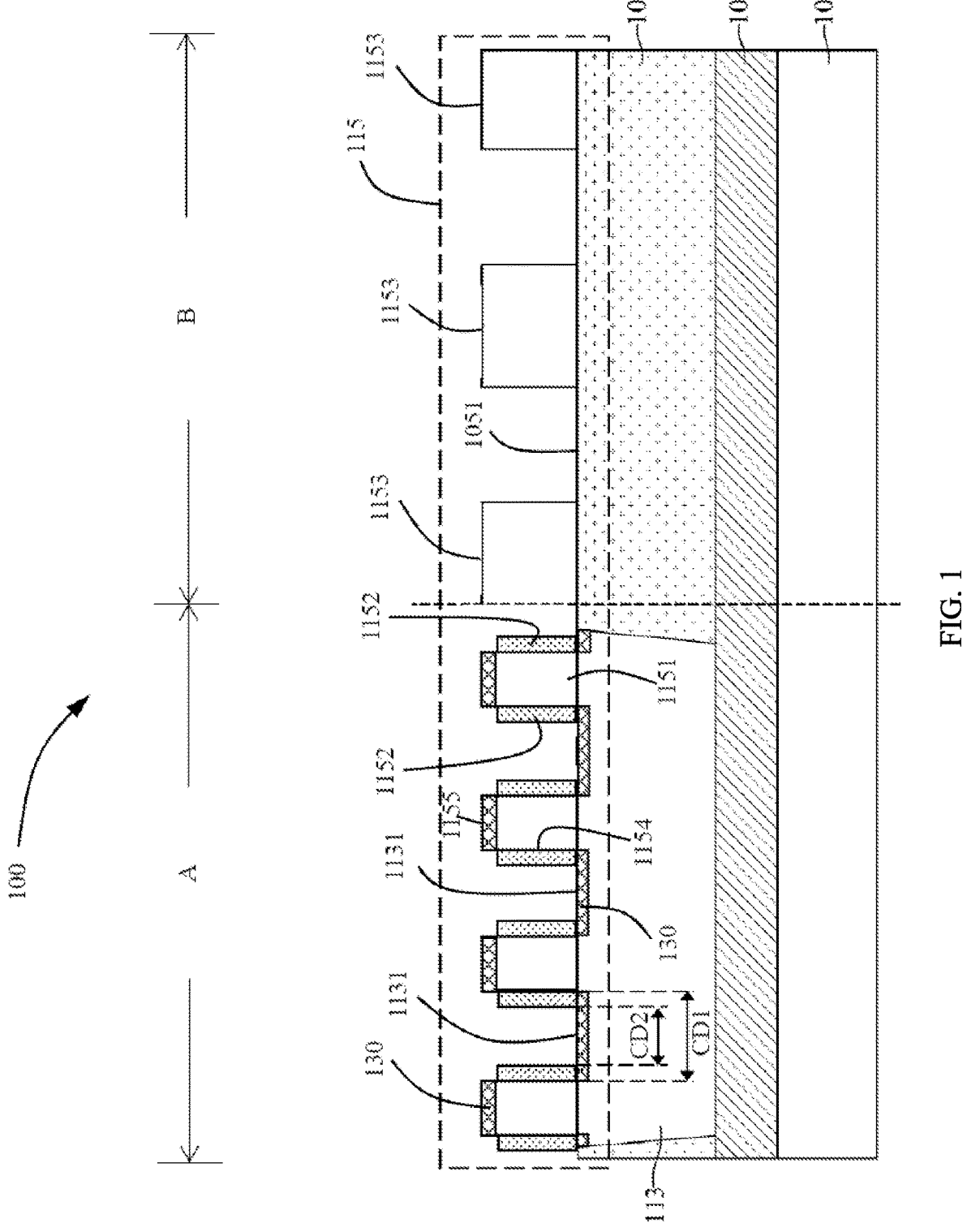
FIG. 1 is a cross-sectional view illustrating a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a cross-sectional view illustrating a semiconductor device structure 100, in accordance with some embodiments. As shown in FIG. 1, the semiconductor device structure 100 includes a first conductive layer 103 disposed over a semiconductor substrate 101, a first dielectric layer 105 disposed over the first conductive layer 103, an energy-removable layer 113 conformally deposited over the first dielectric layer 105, and a patterned mask 115 disposed on the first dielectric layer 105 and the energy-removable layer 113, as shown in FIG. 1 in accordance with some embodiments. Moreover, the semiconductor device structure 100 has a pattern-dense region A and a pattern-loose region B. In order to clarify the disclosure, a dotted line in the middle of FIG. 1 is used to indicate a boundary between the pattern-dense region A and the pattern-loose region B. In some embodiments, a top surface 1131 of the energy-removable layer 113 is substantially coplanar with a top surface 1051 of the first dielectric layer 105.

In some embodiments, the patterned mask 115 has a first pattern 1151, a second pattern 1152, and a third pattern 1153. The first pattern 1151 is disposed in the pattern-dense region A, the second pattern 1152 is disposed over a sidewall 1154 of the first pattern 1151, and the third pattern 1153 is disposed in the pattern-loose region B. In some embodiments, the patterned mask 115 has a plurality of first patterns 1151, a plurality of second patterns 1152, and a plurality of third patterns 1153. The first patterns 1151 are individually disposed in the pattern-dense region A, each of the second patterns 1152 is disposed over a sidewall 1154 of one of the first patterns 1151, and the third patterns 1153 are individually disposed in the pattern-loose region B.

As shown in FIG. 1, the first pattern 1151 is disposed on the top surface 1131 of the energy-removable layer 113. The energy-removable layer 113 has a plurality of processed areas 130 disposed on the top surface 1131 and between adjacent pairs of the first patterns 1151. The first pattern 1151 has a pattern top surface 1155 and the sidewall 1154. A plurality of processed areas 130 are disposed on the pattern top surface 1155. The first pattern 1151 has a first critical dimension CD1, which may be defined as a smallest distance between features of the first pattern 1151.

The second pattern 1152 is disposed on the sidewall 1154 of the first pattern 1151. The second pattern 1152 has a second critical dimension CD2, which is smaller than the first critical dimension CD1 of the first pattern 1151. The second pattern 1152 reduces gaps between the features of the first pattern 1151, which results in the smaller second critical dimension CD2 (CD2<CD1), thereby reducing the critical dimension CD. A method of manufacturing the semiconductor structure 100 in accordance with some embodiments of the present disclosure is presented in detail below.

Figure 19:
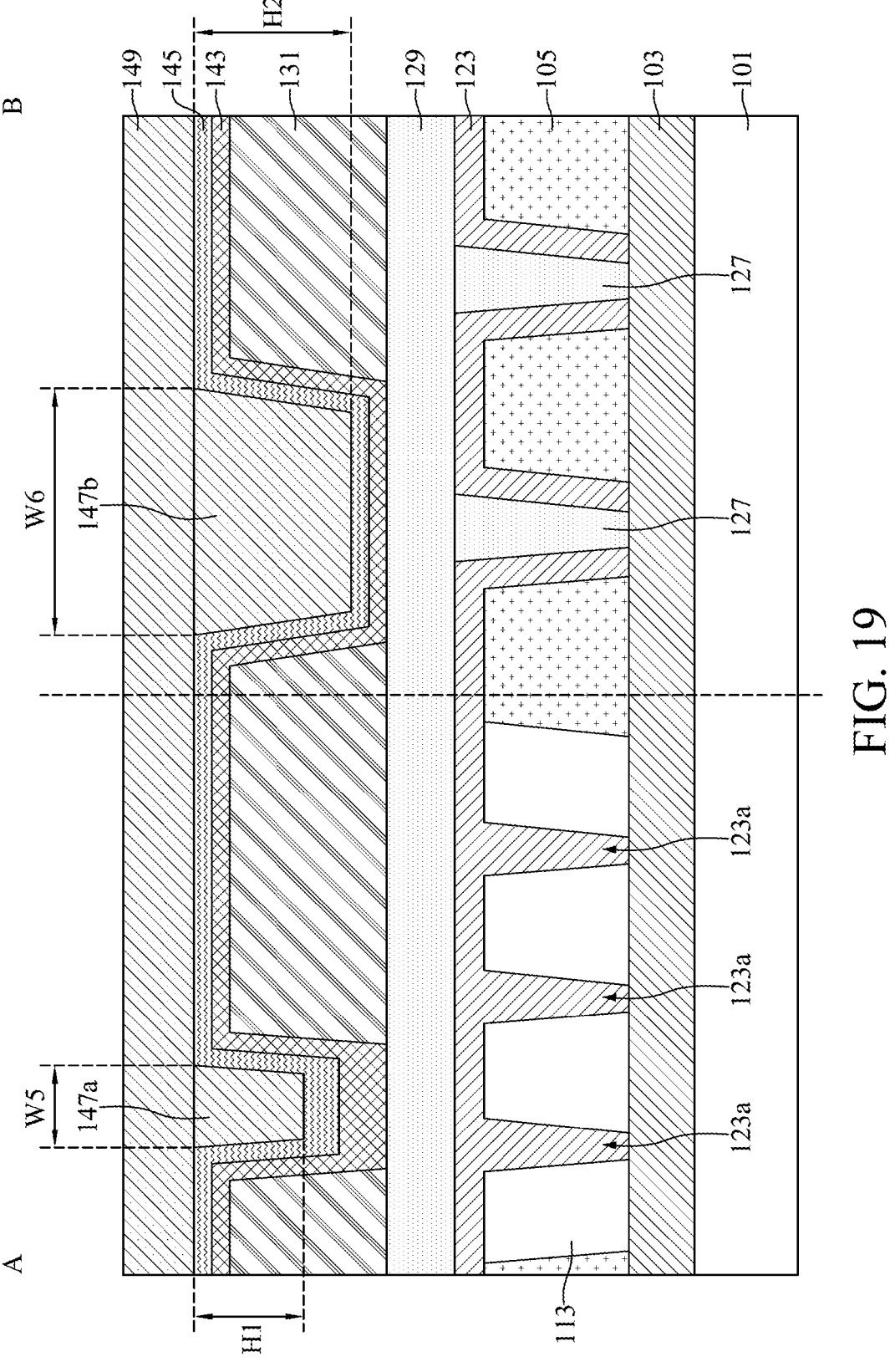
FIG. 19 is a cross-sectional view illustrating an intermediate stage of forming a first conductive structure, a second conductive structure and a third conductive layer during the formation of the semiconductor device structure, in accordance with some embodiments.
Figure 20:
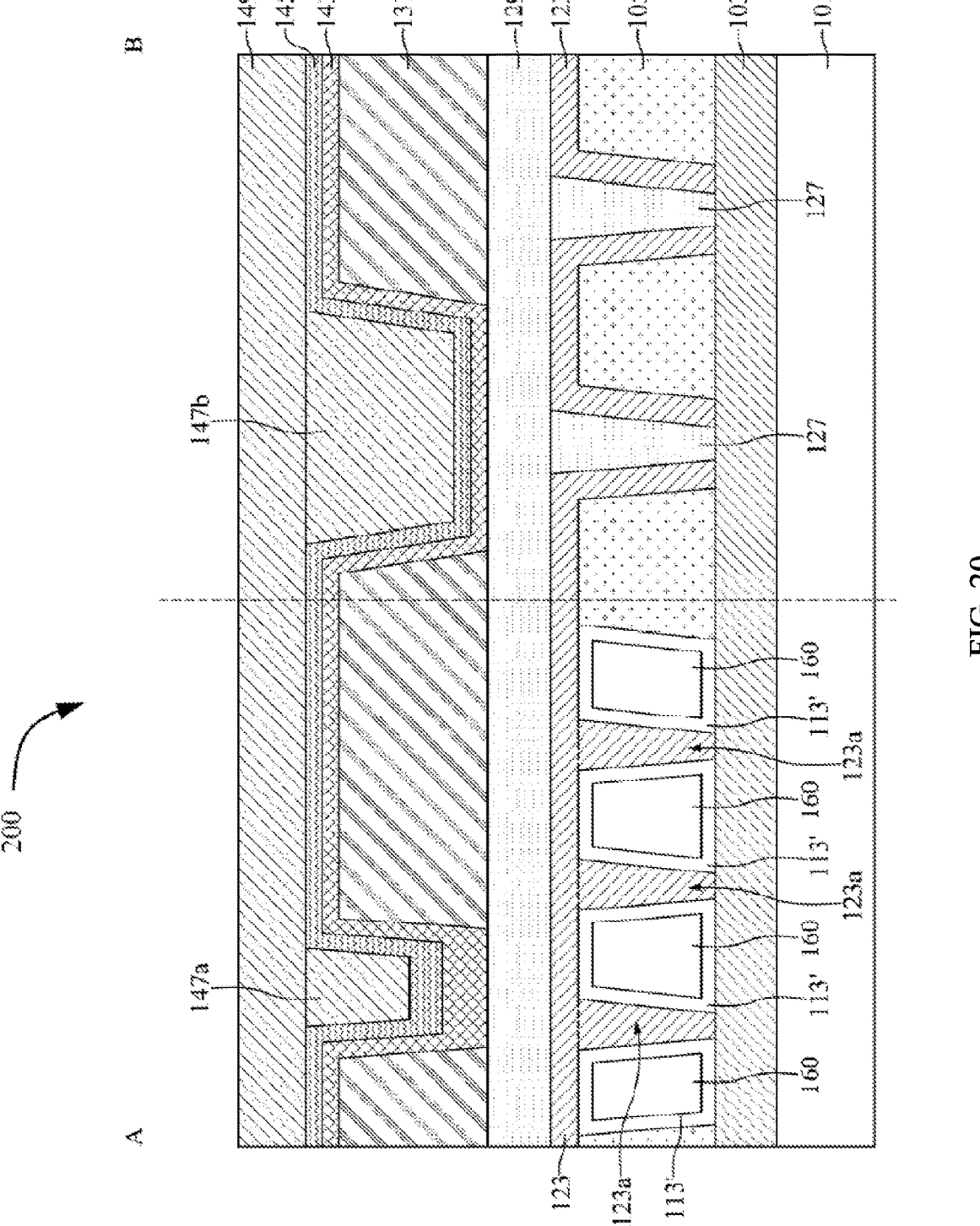
FIG. 20 is a cross-sectional view illustrating the semiconductor device structure, in accordance with some embodiments.

FIG. 20 is a cross-sectional view illustrating a semiconductor device structure, in accordance with some embodiments. As shown in FIG. 20, in accordance with some embodiments, the semiconductor device structure 200 includes a first conductive layer 103 disposed over a semiconductor substrate 101, a first dielectric layer 105 disposed over the first conductive layer 103, a second conductive layer 129 disposed over the first dielectric layer 105, a second dielectric layer 131 disposed over the second conductive layer 129, and a third conductive layer 149 disposed over the second dielectric layer 131. Moreover, the semiconductor device structure 200 has a pattern-dense region A and a pattern-loose region B. In order to clarify the disclosure, a dotted line in the middle of FIG. 19 is used to indicate a boundary between the pattern-dense region A and the pattern-loose region B.

The semiconductor device structure 200 includes a plurality of first conductive plugs 123*a* penetrating through the first dielectric layer 105 in the pattern-dense region A. Moreover, the semiconductor device structure 200 includes energy-removable structures 113' disposed in the first dielectric layer 105 in the pattern-dense region A. Specifically, the first conductive plugs 123*a* are surrounded by the energy-removable structures 113', and each of the energy-removable structures 113' includes an air gap 160.

In some embodiments, the air gaps 160 are enclosed by the energy-removable structures 113'. Although four energy-removable structures 113' are shown in the cross-sectional view of FIG. 20, the four energy-removable structures 113' may be connected to each other in different cross-sectional views. Similar to the energy-removable structures 113', the four air gaps 160 shown in the cross-sectional view of FIG. 20 may also be connected to each other in different cross-sectional views. It should be noted that numbers of the energy-removable structures 113' and the air gaps 160 may be adjusted depending on design requirements of the semiconductor device structure 200.

Still referring to FIG. 20, the semiconductor device structure 200 includes a first lining layer 123 disposed between the first dielectric layer 105 and the second conductive layer 129, wherein the energy-removable structures 113' and the first conductive plugs 123*a* are covered by the first lining layer 123. In some embodiments, dashed lines indicating boundaries between the first conductive plugs 123*a* and the first lining layer 123 are used to clarify the disclosure. No obvious interfaces exist between the first conductive plugs 123*a* and the first lining layer 123.

The semiconductor device structure 200 also includes a plurality of second conductive plugs 127 penetrating through the first lining layer 123 and the first dielectric layer 105 in the pattern-loose region B. Specifically, in the pattern-loose region B, the first lining layer 123 extends between the first dielectric layer 105 and the second conductive plugs 127. In some embodiments, the second conductive plugs 127 are separated from the first dielectric layer 105 by the first lining layer 123.

In addition, the semiconductor device structure 200 includes a second lining layer 143, a third lining layer 145, a first conductive structure 147*a* and a second conductive structure 147*b*, all of which are disposed between the second conductive layer 129 and the third conductive layer 149. In some embodiments, the first conductive structure 147*a* is in the pattern-dense region A, and the second conductive structure 147*b* is in the pattern-loose region B. In some embodiments, portions of the second and third lining layers 143 and 145 are sandwiched between the second dielectric layer 131 and the third conductive layer 149. In some embodiments, the third lining layer 145 is disposed over the second lining layer 143, and sidewalls and bottom surfaces of the first conductive structure 147*a* and the second conductive structure 147*b* are covered by the third lining layer 145.

In some embodiments, the semiconductor device structure 200 is a dynamic random-access memory (DRAM). In such embodiments, the conductive layers (e.g., the first conductive layer 103, the second conductive layer 129 and the third conductive layer 149) can serve as bit lines (BL), storage nodes, and/or wiring layers for the DRAM, and the conductive plugs (e.g., the first conductive plugs 123*a* and the second conductive plugs 127) and the conductive structures (e.g., the first conductive structure 147*a* and the second conductive structure 147*b*) can serve as bit line contact plugs, capacitor contact plugs, and/or interconnect structures for the DRAM.

In some embodiments, the first conductive plugs 123*a* in the pattern-dense region A and the first lining layer 123 are integrally formed. In some embodiments, the first conductive plugs 123*a* and the first lining layer 123 are made of a same material, and the first conductive plugs 123*a* and the second conductive plugs 127 are made of different materials.

In some embodiments, the first conductive plugs 123a and the first lining layer 123 are made of a manganese-containing material.

For example, the first lining layer 123 and the first conductive plugs 123a are each made of (or include) copper manganese (CuMn), and the first conductive layer 103, the second conductive layer 129 and the second conductive plugs 127 are each made of (or include) copper (Cu), in accordance with some embodiments. Additionally, in some embodiments, the first conductive structure 147a, the second conductive structure 147b and the third conductive layer 149 are each made of (or include) copper (Cu), the second lining layer 143 is made of (or includes) manganese-rich manganese silicon (MnSi) or manganese (Mn), and the third lining layer 145 is made of (or includes) copper manganese (CuMn).

FIG. 2 is a flow diagram illustrating a method 10 of forming a semiconductor device structure (e.g., the semiconductor device structure 100/200). The method 10 includes steps S11, S13, S15, S17, S19, S21, S23, S25 and S27, in accordance with some embodiments. The steps S11 to S27 of FIG. 2 are elaborated in connection with the following figures.

FIGS. 3 to 8 are cross-sectional views illustrating intermediate stages of forming the semiconductor device structure 100, and FIGS. 9 to 19 are cross-sectional views illustrating intermediate stages of forming the semiconductor device structure 200, in accordance with some embodiments. The semiconductor device structure 100 is an intermediate part of the semiconductor device structure 200.

Figure 3:
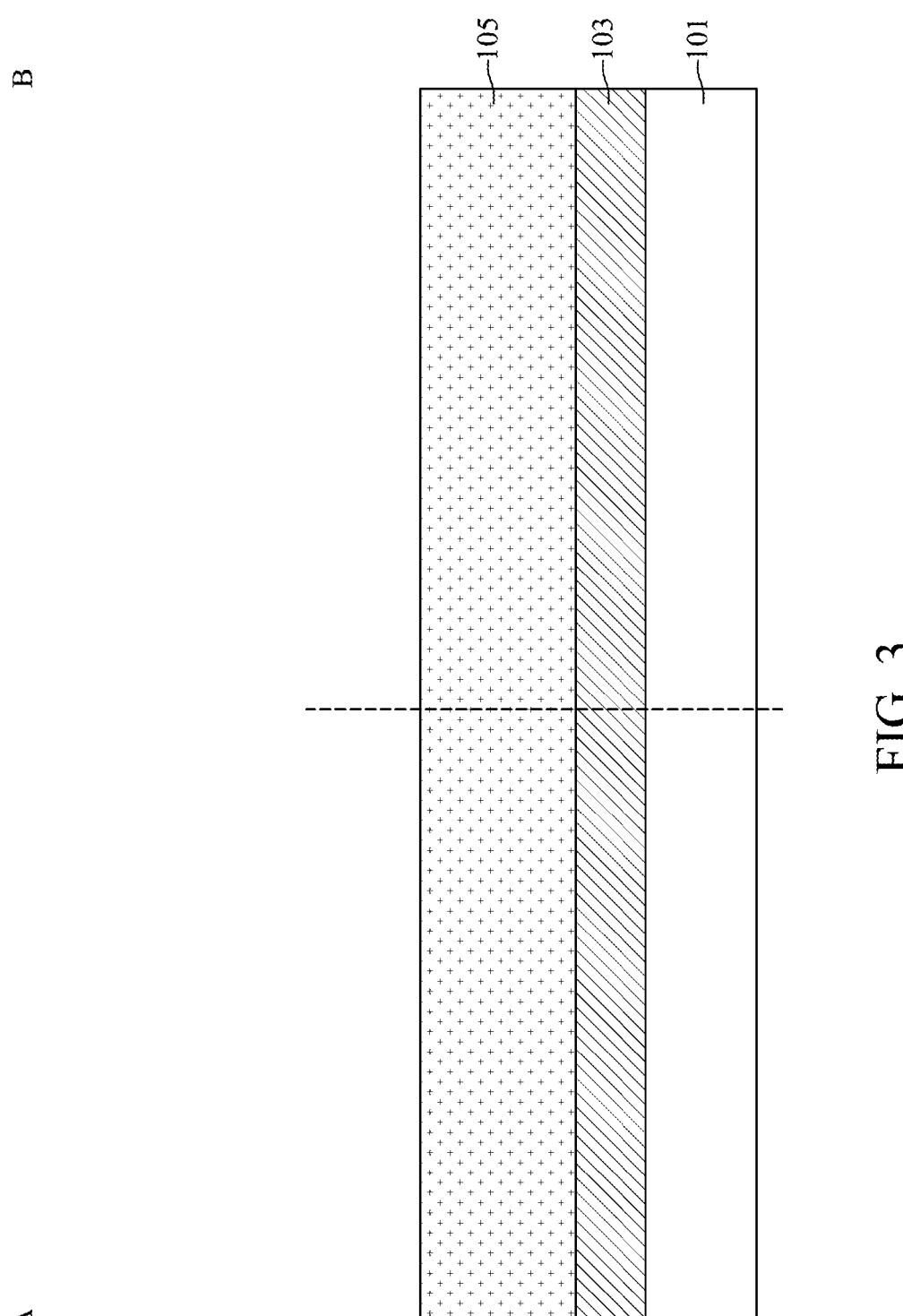
FIG. 3 is a cross-sectional view illustrating an intermediate stage of sequentially forming a first conductive layer and a first dielectric layer over a semiconductor substrate during the formation of the semiconductor device structure, in accordance with some embodiments.

As shown in FIG. 3, the semiconductor substrate 101 is provided. The semiconductor substrate 101 may be a semiconductor wafer such as a silicon wafer. Alternatively or additionally, the semiconductor substrate 101 may include elementary semiconductor materials, compound semiconductor materials, and/or alloy semiconductor materials. Examples of the elementary semiconductor materials may include, but are not limited to, crystal silicon, polycrystalline silicon, amorphous silicon, germanium, and/or diamond. Examples of the compound semiconductor materials may include, but are not limited to, silicon carbide, gallium arsenic, gallium phosphide, indium phosphide, indium arsenide, and/or indium antimonide. Examples of the alloy semiconductor materials may include, but are not limited to, SiGe, GaAsP, AlInAs, AlGaAs, GaInAs, GaInP, and/or GaInAsP.

In some embodiments, the semiconductor substrate 101 includes an epitaxial layer. For example, the semiconductor substrate 101 has an epitaxial layer overlying a bulk semiconductor. In some embodiments, the semiconductor substrate 101 is a semiconductor-on-insulator substrate which may include a substrate, a buried oxide layer over the substrate, and a semiconductor layer over the buried oxide layer, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other applicable methods.

Still referring to FIG. 3, the first conductive layer 103 is formed over the semiconductor substrate 101, and the first dielectric layer 105 is formed over the first conductive layer 103, in accordance with some embodiments. The respective steps are illustrated as the steps S11 and S13 in the method 10 shown in FIG. 2.

In some embodiments, the first conductive layer 103 includes copper (Cu), and the first conductive layer 103 is formed by a deposition process, such as a chemical vapor deposition (CVD) process, a physical vapor deposition (PVD) process, an atomic layer deposition (ALD) process, a metal organic chemical vapor deposition (MOCVD) process, a sputtering process, a plating process, or another applicable process. In some embodiments, the first dielectric layer 105 includes silicon oxide, silicon nitride, silicon oxynitride or another applicable dielectric material, and the first dielectric layer 105 is formed by a deposition process, such as a CVD process, a PVD process, an ALD process, a spin-coating process or another applicable process.

Figure 4:
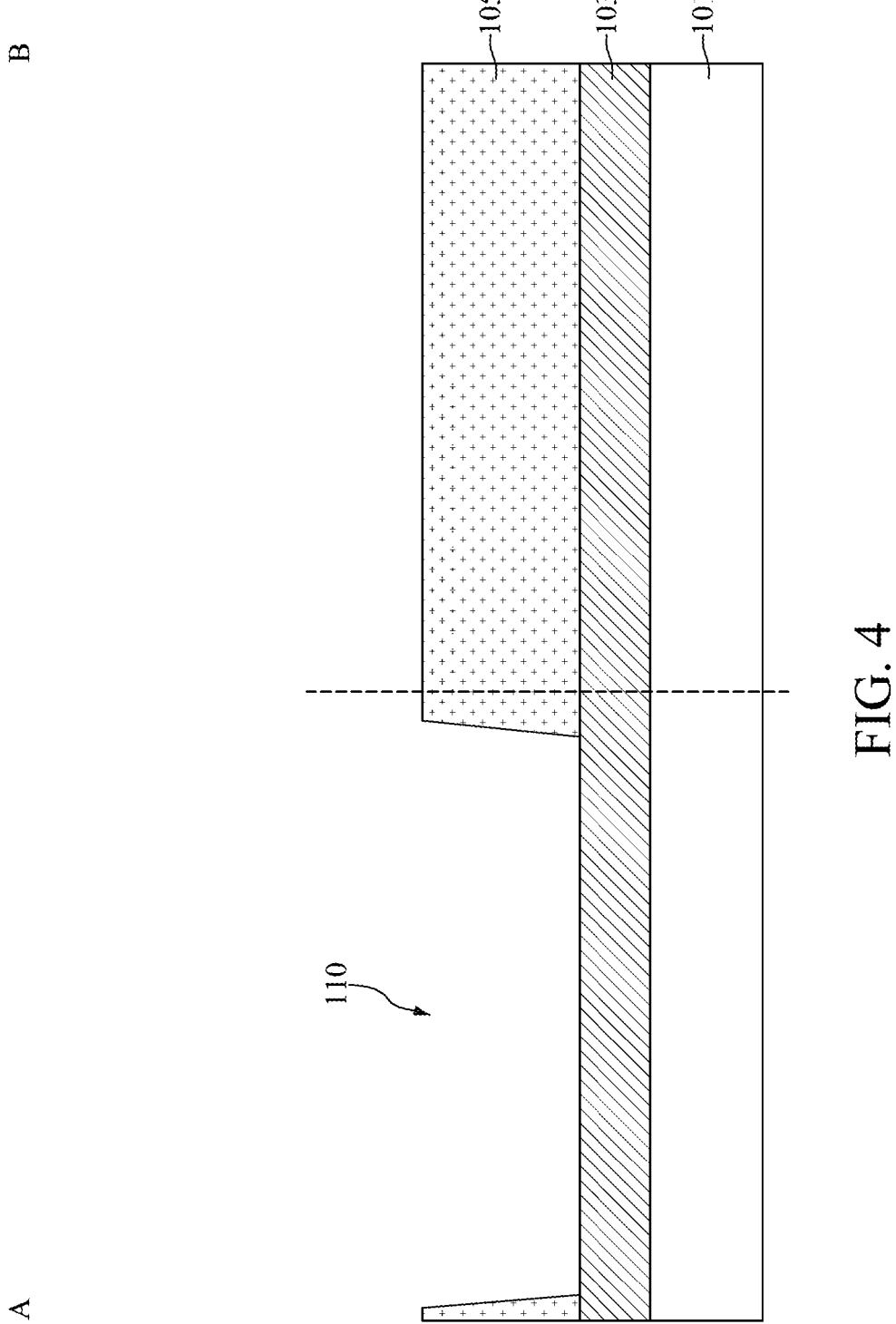
FIG. 4 is a cross-sectional view illustrating an intermediate stage of etching the first dielectric layer during the formation of the semiconductor device structure, in accordance with some embodiments.

Next, an etching process is performed on the first dielectric layer 105 to form an opening 110 exposing the first conductive layer 103, as shown in FIG. 4 in accordance with some embodiments. In some embodiments, the opening 110 is in the pattern-dense region A. The formation of the opening 110 may include forming a patterned mask (not shown) over the first dielectric layer 105, and etching the first dielectric layer 105 while using the patterned mask as a mask. In addition, the etching process for forming the opening 110 may be a wet-etching process, a dry-etching process, or a combination thereof.

Figure 5:
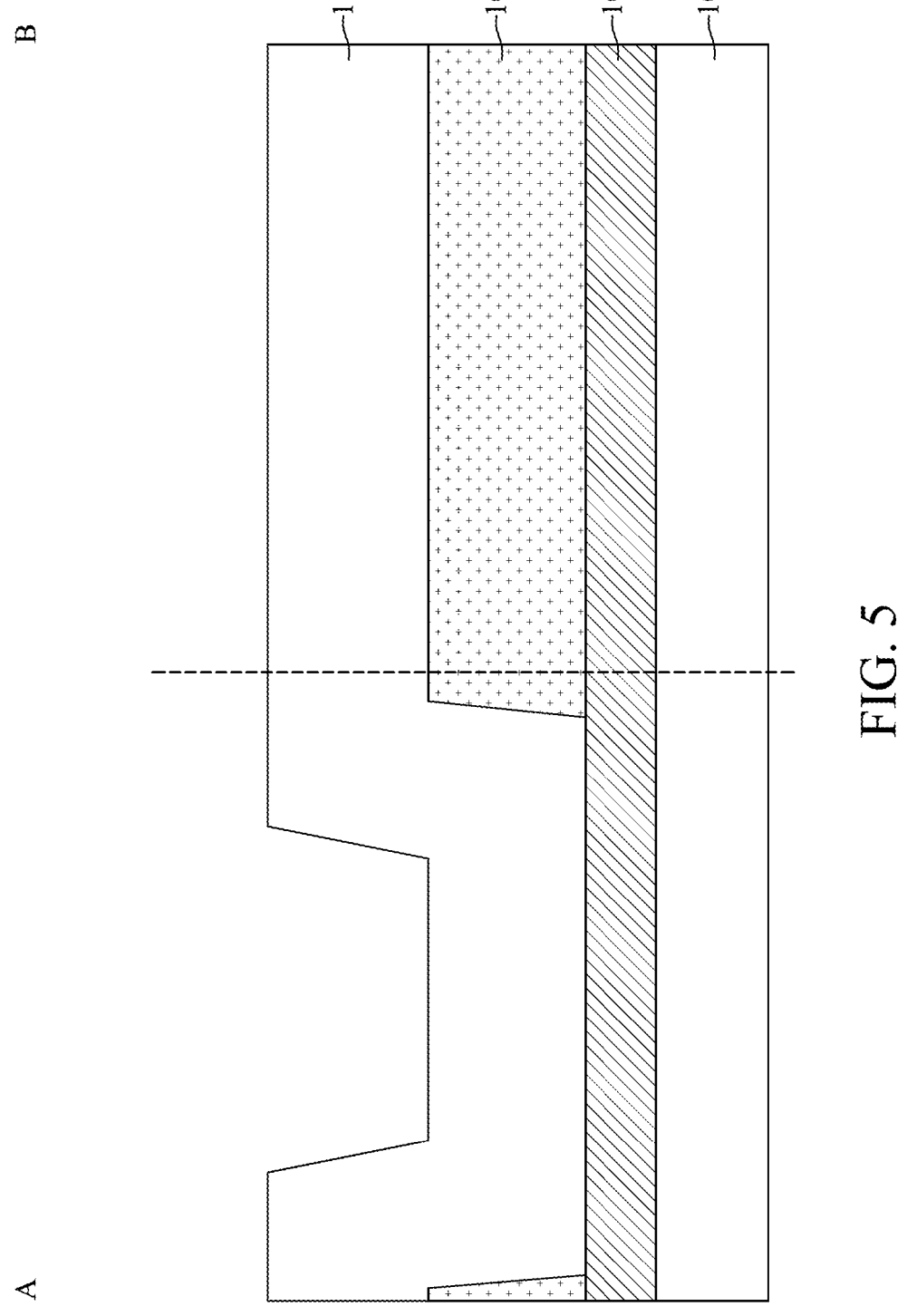
FIG. 5 is a cross-sectional view illustrating an intermediate stage of forming an energy-removable layer during the formation of the semiconductor device structure, in accordance with some embodiments.

Subsequently, an energy-removable layer 113 is conformally deposited over the first dielectric layer 105, as shown in FIG. 5 in accordance with some embodiments. In some embodiments, sidewalls and a bottom surface of the opening 110 (see FIG. 4) are covered by the energy-removable layer 113.

In some embodiments, materials of the energy-removable layer 113 include a base material and a decomposable porogen material that is substantially removed once it is exposed to an energy source (e.g., heat). In some embodiments, the base material includes hydrogen silsesquioxane (HSQ), methylsilsesquioxane (MSQ), porous polyarylether (PAE), porous SiLK, or porous silicon oxide ($SiO_2$), and the decomposable porogen material includes a porogen organic compound, which, in subsequent processes, can provide porosity to a space originally occupied by the energy-removable layer 113. In addition, the energy-removable layer 113 may be deposited by a CVD process, a PVD process, an ALD process, a spin-coating process, or another applicable process.

Figure 6:
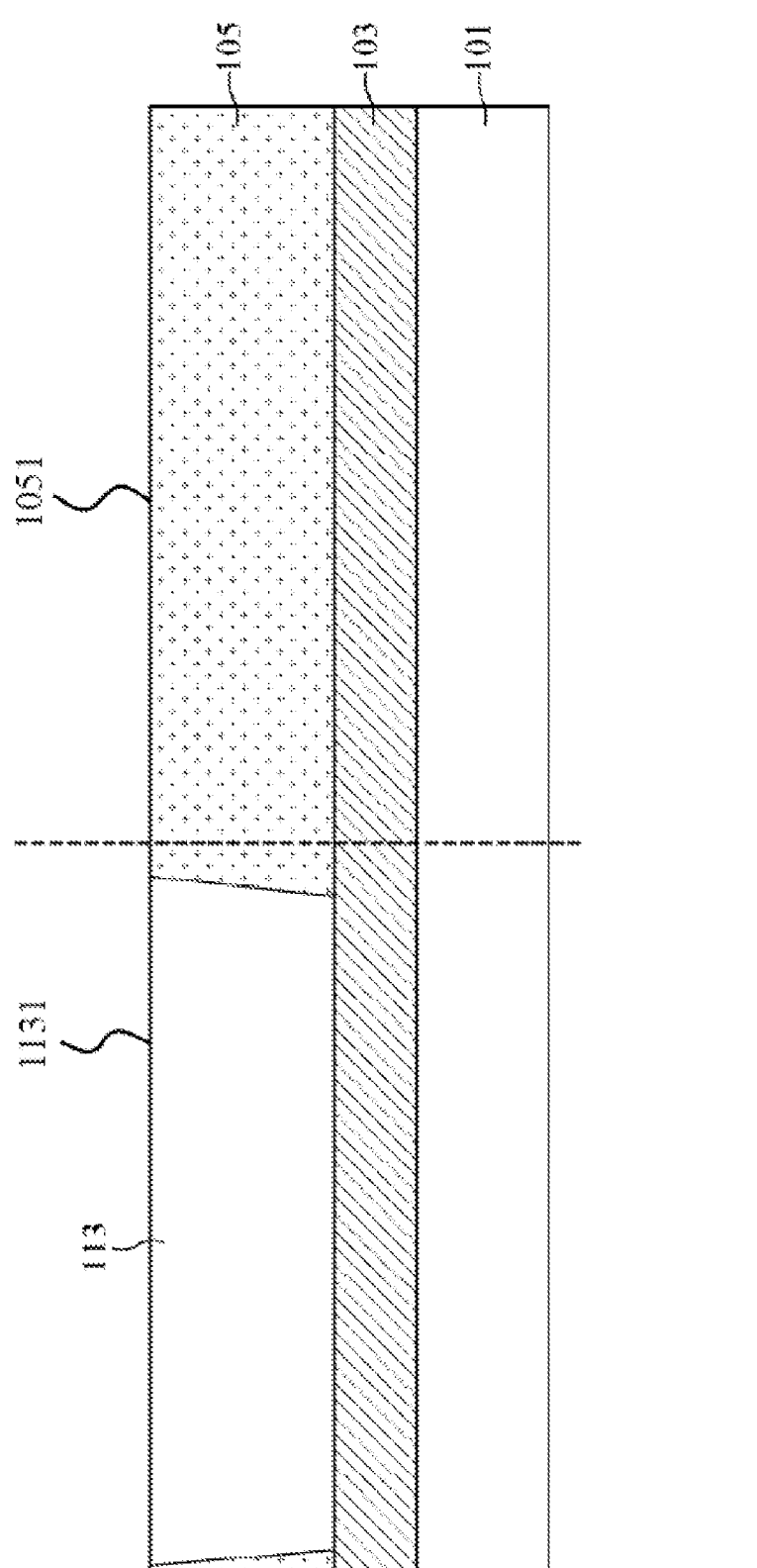
FIG. 6 is a cross-sectional view illustrating an intermediate stage of partially removing the energy-removable layer during the formation of the semiconductor device structure, in accordance with some embodiments.

Next, a planarizing process is performed on the energy-removable layer 113 so as to remove a portion of the energy-removable layer 113, as shown in FIG. 6 in accordance with some embodiments. The planarizing process may include a chemical mechanical polishing (CMP) process, an etch-back process, or another applicable process. After the planarizing process, the top surface 1131 of the energy-removable layer 113 is substantially coplanar with the top surface 1051 of the first dielectric layer 105. In some embodiments, a portion of the first dielectric layer 105 in the pattern-dense region A is replaced by the energy-removable layer 113 during the intermediate stages shown in FIGS. 4 to 6, and the respective step is illustrated as the step S15 in the method 10 shown in FIG. 2.

Figure 7A:
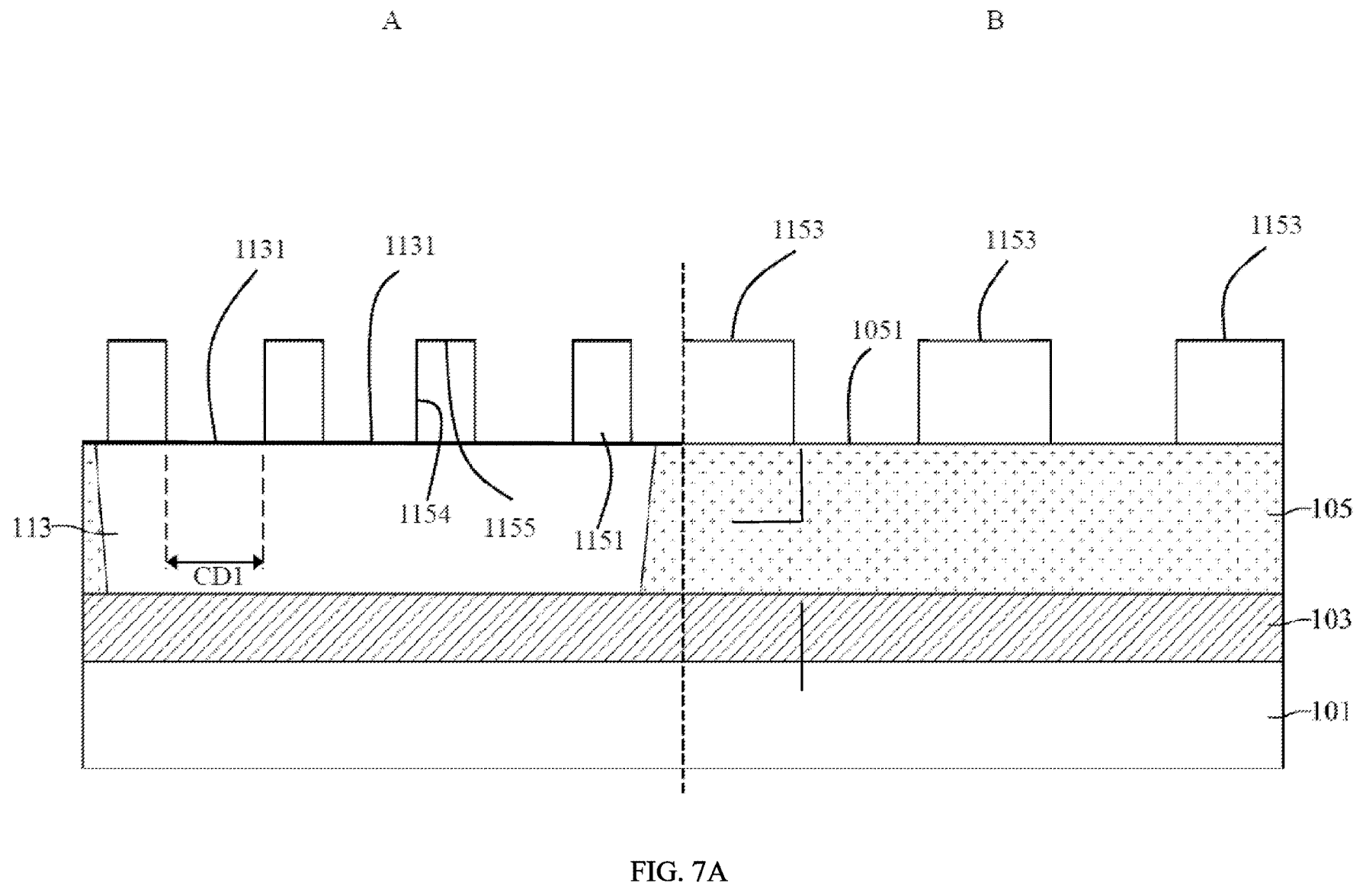
Figure 7B:
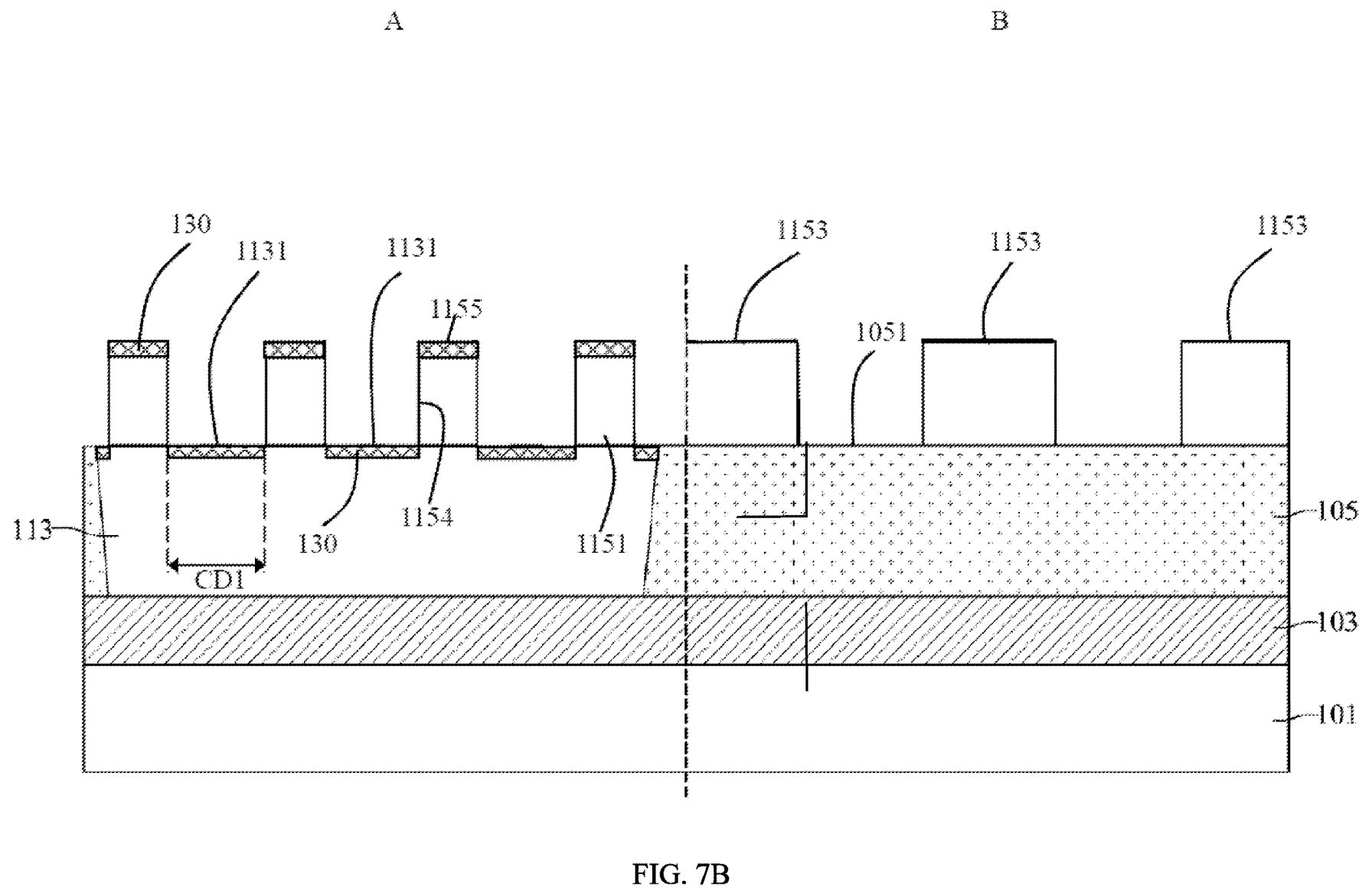
Figure 7C:
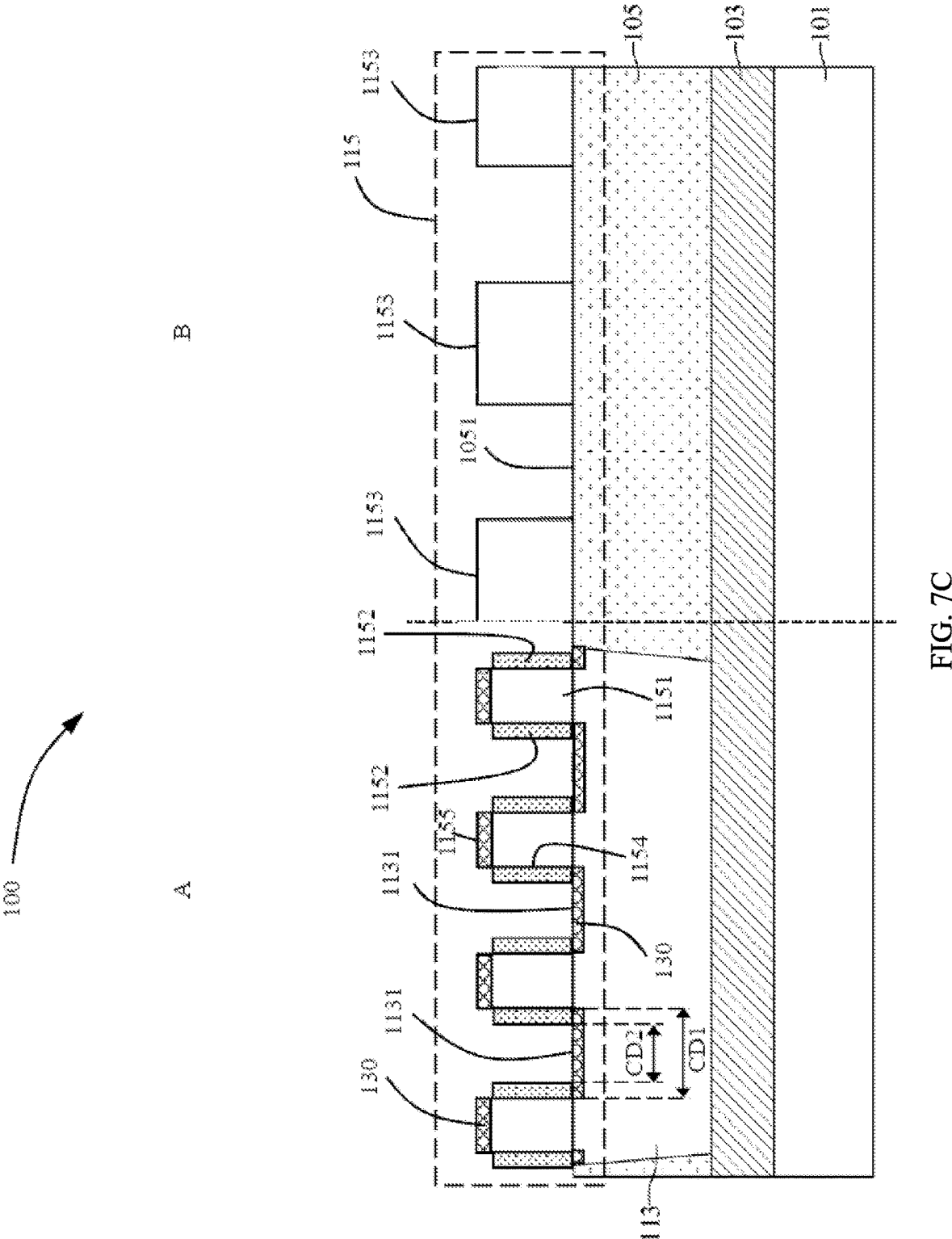
FIG. 7C is a cross-sectional view illustrating an intermediate stage of forming a second pattern over a sidewall of the first pattern during the formation of the semiconductor device structure, in accordance with some embodiments.

Next, a patterned mask 115 is formed over the energy-removable layer 113 and the dielectric layer 105, as shown in FIGS. 7A to 7C in accordance with some embodiments. In some embodiments, portions of the energy-removable layer 113 in the pattern-dense region A and portions of the first dielectric layer 105 in the pattern-loose region B are exposed through the patterned mask 115. The patterned mask 115 is composed of the first pattern 1151, the second pattern 1152 and the third pattern 1153.

In step S151, the first pattern 1151 is formed over the energy-removable layer 113 in the pattern-dense region A and the third pattern 1153 is formed over the dielectric layer 105 in the pattern-loose region B, as shown in FIG. 7A in accordance with some embodiments. In some embodiments, the first pattern 1151 and the third pattern 1153 are formed simultaneously. As mentioned above, the material of the first pattern 1151 may be silicon, more specifically amorphous silicon or polysilicon. A material of the third pattern 1153 may be silicon, more specifically amorphous silicon or polysilicon. In some embodiments, the material of the first pattern 1151 is same as that of the third pattern 1153. The step S151 may be performed with traditional photolithographic techniques, and the first critical dimension CD1 of the first pattern 1151 is limited by the photolithographic techniques used. The respective step is illustrated as the step S151 in the method 10 shown in FIG. 2.

In step S153, the plurality of processed areas 130 are formed on the pattern top surface 1155 of the first pattern 1151 and on the portion of the top surface of the energy-removable layer 113 that is exposed by the first pattern 1151, as shown in FIG. 7B in accordance with some embodiments. In one embodiment of the present disclosure, the formation of the processed areas 130 may include a process of ion implantation. In contrast to traditional ion implantation used for doping, a purpose of the ion implantation of the present embodiment is to damage horizontal surfaces of the previously-formed semiconductor structure, namely the pattern top surface 1155 and the top surface 1131 exposed by the first pattern 1151, to form processed areas 130 so that the subsequent formation of the second pattern 1152 may exclude the processed areas 130. The respective step is illustrated as the step S153 in the method 10 shown in FIG. 2.

In step S155, the second pattern 1152 is formed on the sidewalls 1154 of the first pattern 1151, as shown in FIG. 7C in accordance with some embodiments. As previously mentioned, the processed areas 130, which include all exposed horizontal surfaces, are damaged so the second pattern 1152 cannot form on them. The second pattern 1152 is therefore formed only on the sidewalls 1154 of the first pattern 1151. In one embodiment, the formation of the second pattern 1152 may include thermal oxidation and the first pattern 110 may include silicon. In some embodiments, the second pattern 1152 can be used as gate oxides, which are commonly silicon oxides. Thermal oxidation oxidizes the sidewall 1154 of the first pattern 110 and forms a layer of silicon dioxide, which comprises the second pattern 1152; while the other surfaces, such as the pattern top surface 1155 and the top surface 1131 exposed by the first pattern 110, are processed so that no silicon dioxide can be formed thereon. The aforementioned ion implantation can be used in such embodiment to damage the processed areas 130 in order to limit the oxidation of the sidewall 1154 of the first pattern 1151. The respective step is illustrated as the step S155 in the method 10 shown in FIG. 2.

Since the second pattern 1152 is not formed by photolithographic techniques, the second critical dimension CD2 is not constrained by the limit of the techniques in use. For example, in the aforementioned embodiment, the second pattern 1152 is formed by thermal oxidation so that the oxidation layer of the sidewall 1154 of the first pattern 1151 can be easily controlled to reduce the first critical dimension CD1 of the first pattern 1151 to the second critical dimension CD2 of the second pattern 1152 since thermal oxidation is well-known by people having ordinary skill in the art. That is, the second critical dimension CD2 is smaller than the first critical dimension CD1. Thus, a smaller critical dimension may be achieved without employing new (and possibly faulty and costly) photolithographic techniques.

Figure 8:
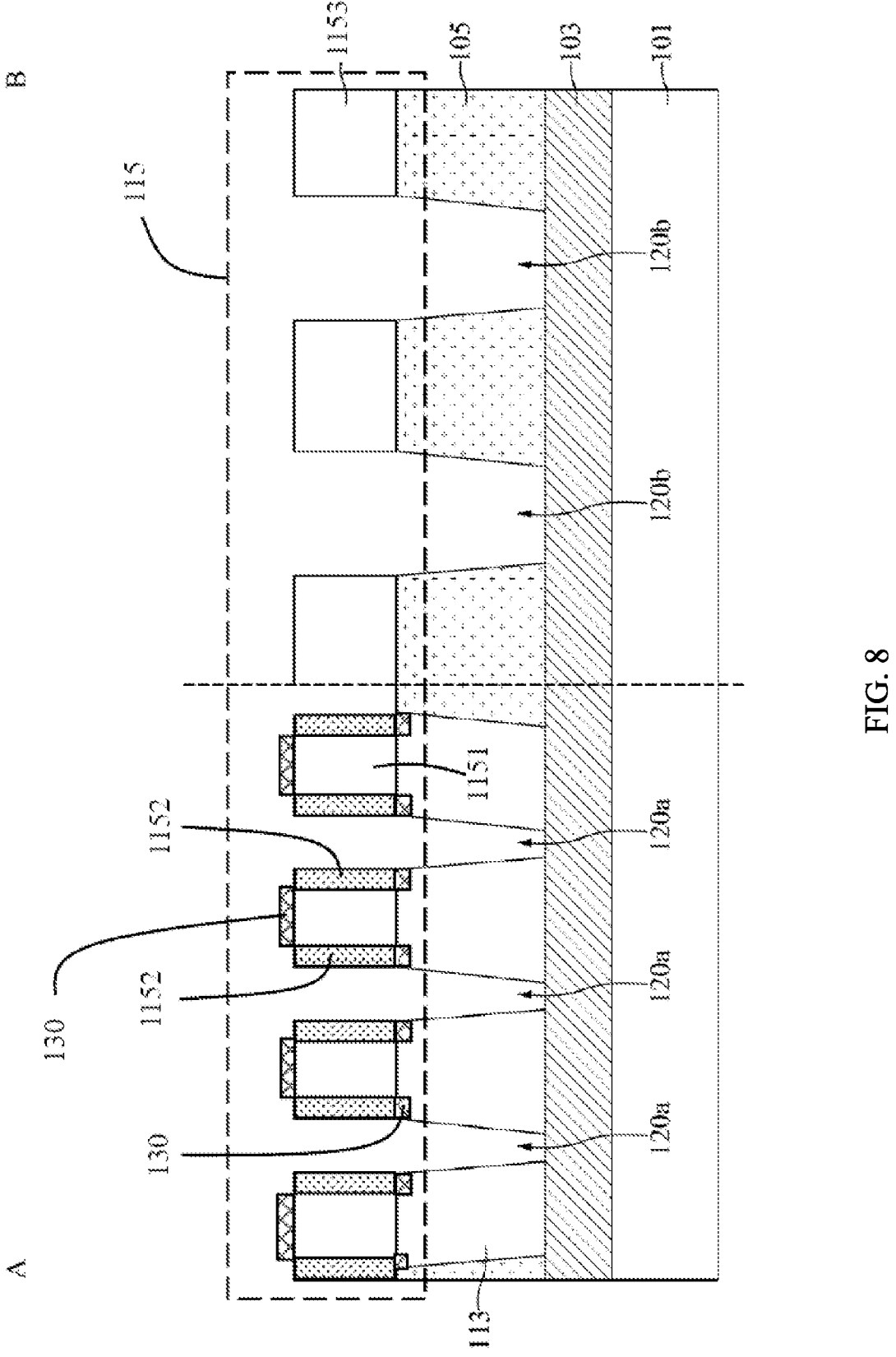
FIG. 8 is a cross-sectional view illustrating an intermediate stage of etching the energy-removable layer and the first dielectric layer during the formation of the semiconductor device structure, in accordance with some embodiments.

Subsequently, the energy-removable layer 113 and the first dielectric layer 105 are etched using the patterned mask 115 as a mask, such that openings (e.g., first openings) 120a are formed in the energy-removable layer 113 and openings (e.g., second openings) 120b are formed in the dielectric layer 105, as shown in FIG. 8 in accordance with some embodiments. In some embodiments, the openings 120a are in the pattern-dense region A, and the openings 120b are in the pattern-loose region B. In some embodiments, the first conductive layer 103 is partially exposed through the openings 120a and 120b. The etching process may be a wet-etching process, a dry-etching process, or a combination thereof. The respective step is illustrated as the step S17 in the method 10 shown in FIG. 2.

Figure 9:
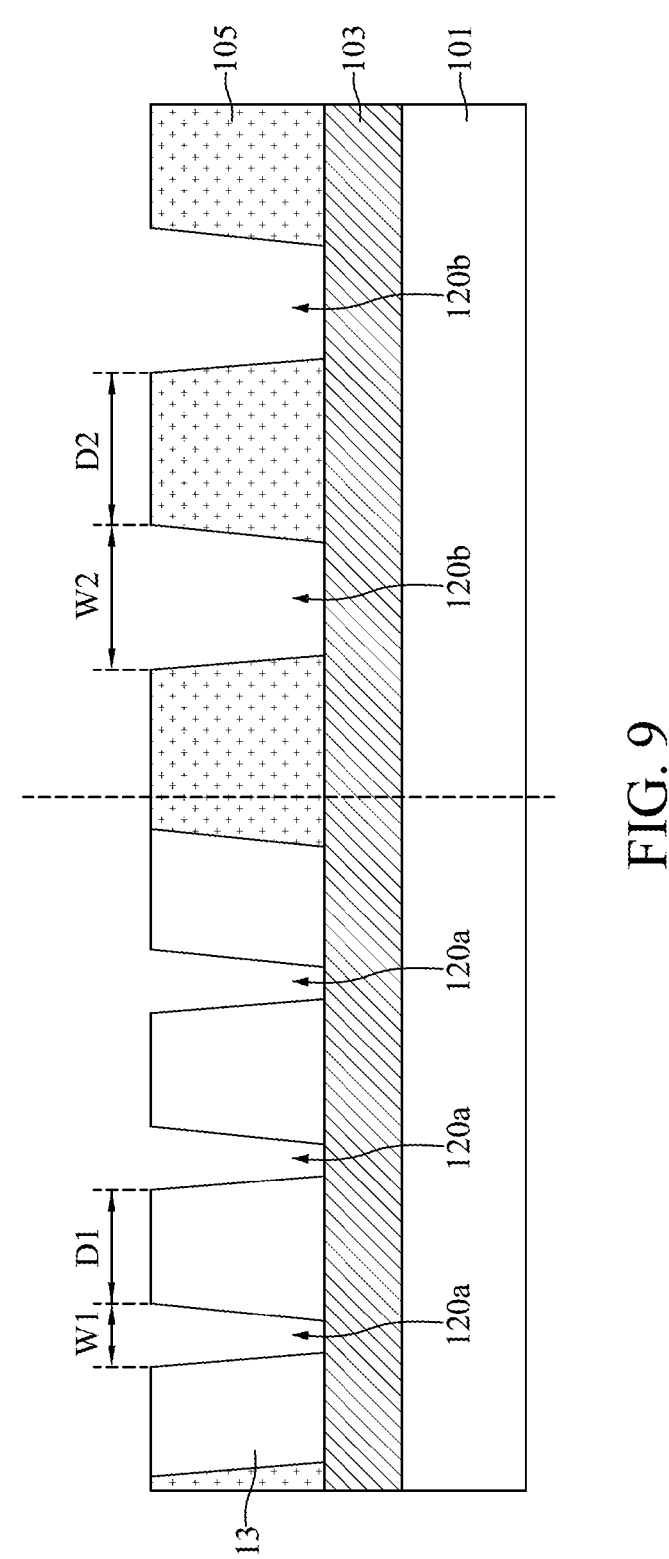
FIG. 9 is a cross-sectional view illustrating an intermediate stage of removing the first pattern and the second pattern during the formation of the semiconductor device structure, in accordance with some embodiments.

After the openings 120a and 120b are formed, the patterned mask 115 is removed, as shown in FIG. 9 in accordance with some embodiments. In some embodiments, each of the openings 120a has a width W1, and each of the openings 120b has a width W2, wherein the width W2 is greater than the width W1. In some embodiments, the widths W1 and W2 are defined as topmost widths of the openings 120a and 120b. Additionally, in some embodiments, each adjacent pair of the openings 120a has a distance D1 therebetween, and each adjacent pair of the openings 120b has a distance D2 therebetween, wherein the distance D2 is greater than the distance D1.

Figure 10:
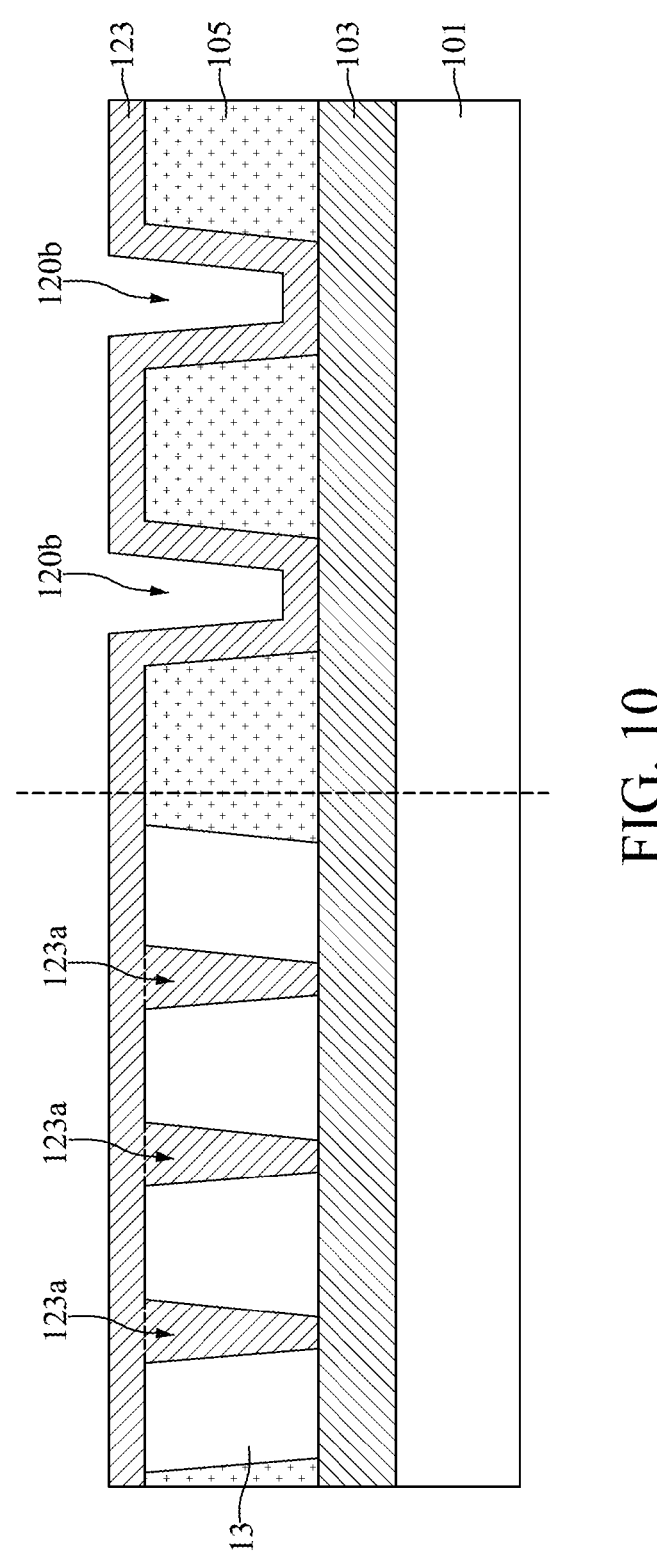
FIG. 10 is a cross-sectional view illustrating an intermediate stage of depositing a first lining layer and forming first conductive plugs during the formation of the semiconductor device structure, in accordance with some embodiments.

Next, the first lining layer 123 is deposited over the energy-removable layer 113 and the first dielectric layer 105, as shown in FIG. 10 in accordance with some embodiments. It should be noted that the openings 120a are entirely filled by the first lining layer 123, and the portions of the first lining layer 123 in the openings 120a form the first conductive plugs 123a. Meanwhile, each of the openings 120b is partially filled by the first lining layer 123, such that the remaining portions of the openings 120b are formed over the first lining layer 123. The respective step is illustrated as the step S19 in the method 10 shown in FIG. 2.

In some embodiments, since the first lining layer 123 and the first conductive plugs 123a are integrally formed, the first lining layer 123 and the first conductive plugs 123a are made of a same material, such as a manganese-containing material. In some embodiments, the first lining layer 123 and the first conductive plugs 123a are made of (or include) copper manganese (CuMn). Moreover, the first lining layer 123 may be formed by a deposition process, such as a CVD process, a PVD process, an ALD process, or another applicable process.

Figure 11:
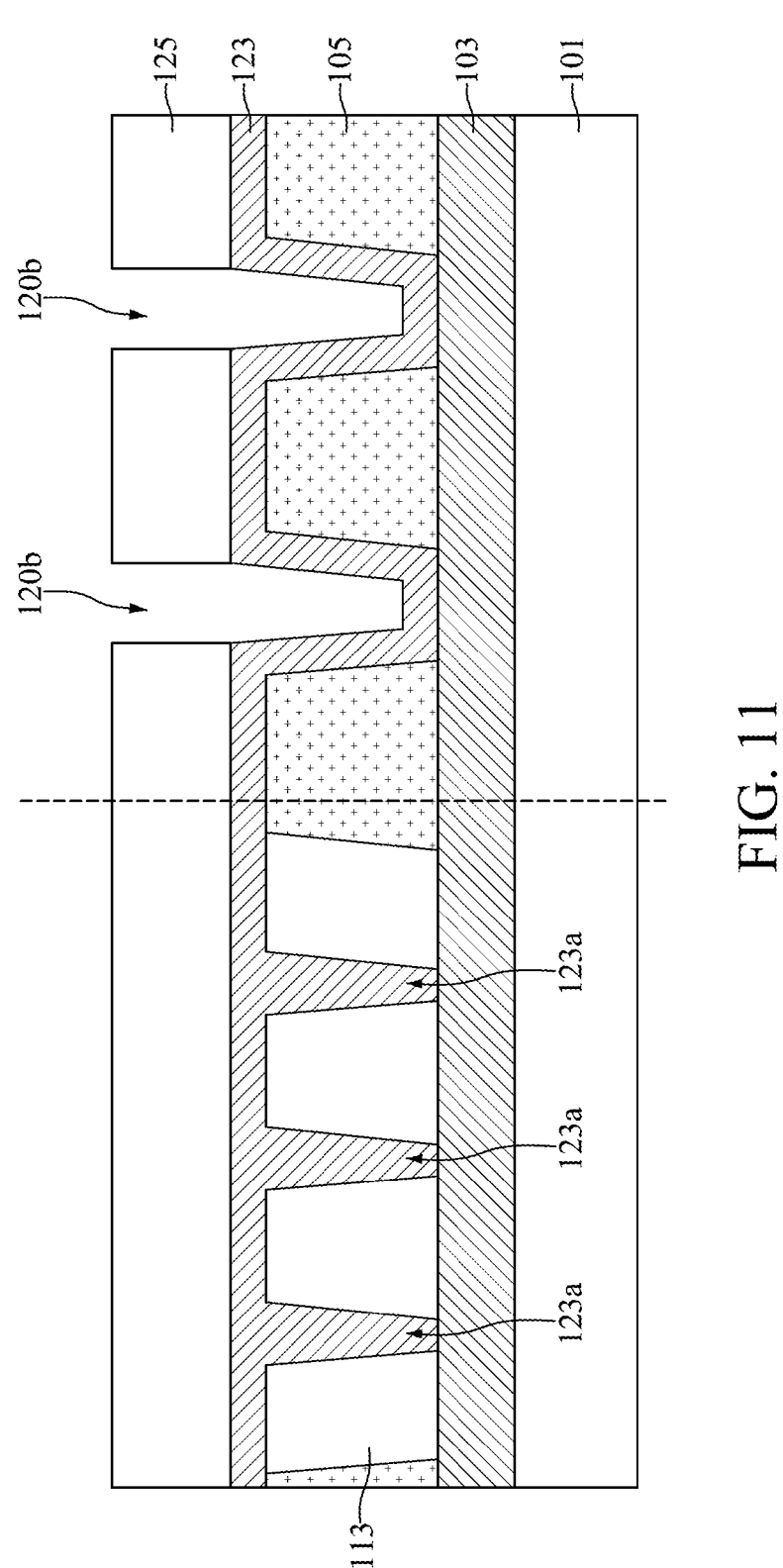
FIG. 11 is a cross-sectional view illustrating an intermediate stage of forming a patterned mask over the first lining layer during the formation of the semiconductor device structure, in accordance with some embodiments.

Subsequently, a patterned mask 125 is formed over the first lining layer 123, as shown in FIG. 11 in accordance with some embodiments. In some embodiments, portions of the first lining layer 123 in the bottom of the openings 120b are exposed through the patterned mask 125.

Figure 12:
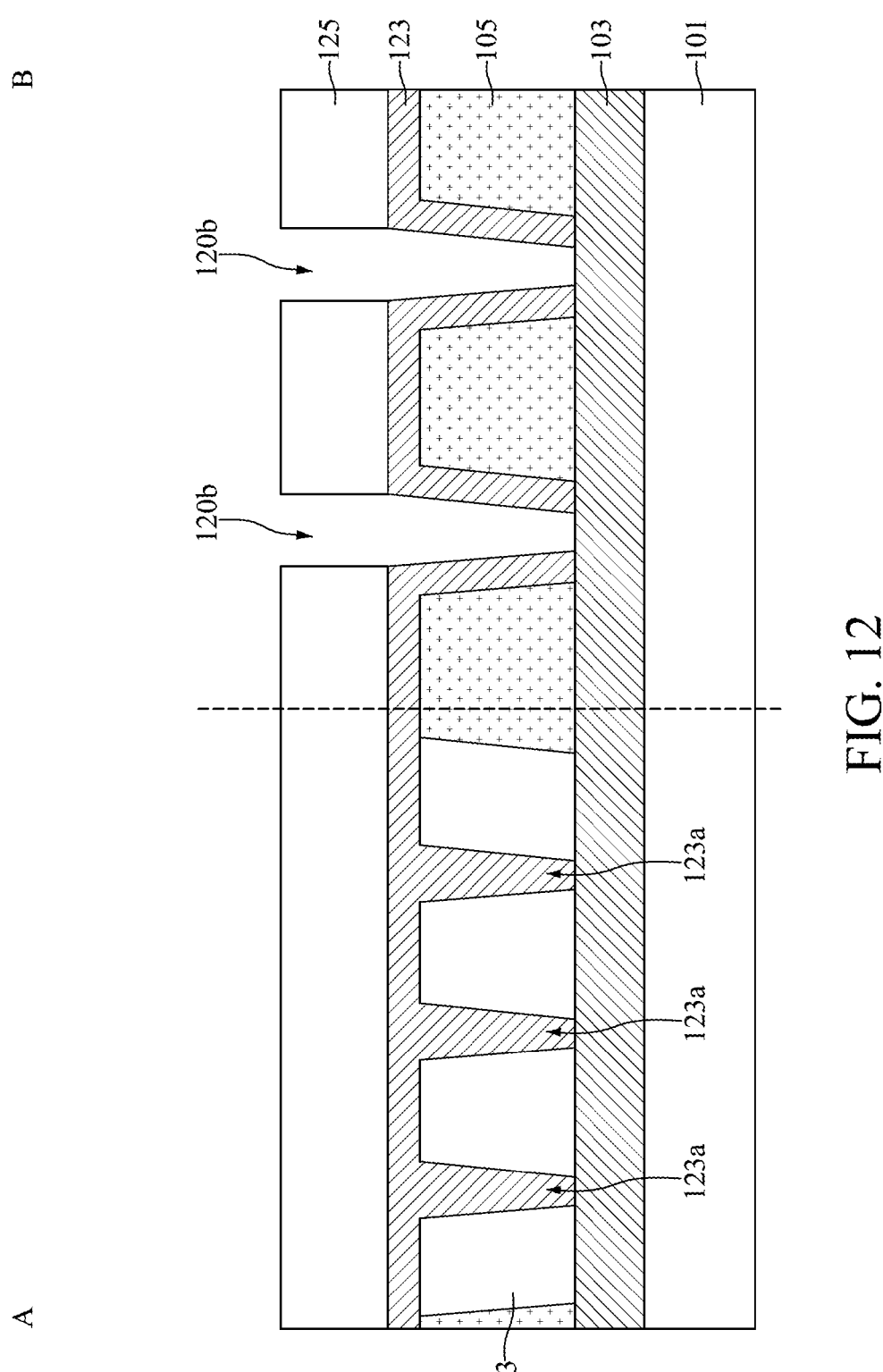
FIG. 12 is a cross-sectional view illustrating an intermediate stage of partially removing the first lining layer to expose the first conductive layer during the formation of the semiconductor device structure, in accordance with some embodiments.

Next, the first lining layer 123 is etched using the patterned mask 125 as a mask, such that the first conductive layer 103 is partially exposed through the openings 120b, as shown in FIG. 12 in accordance with some embodiments. The etching process may be a wet-etching process, a dry-etching process, or a combination thereof. The respective step is illustrated as the step S21 in the method 10 shown in FIG. 2.

Figure 13:
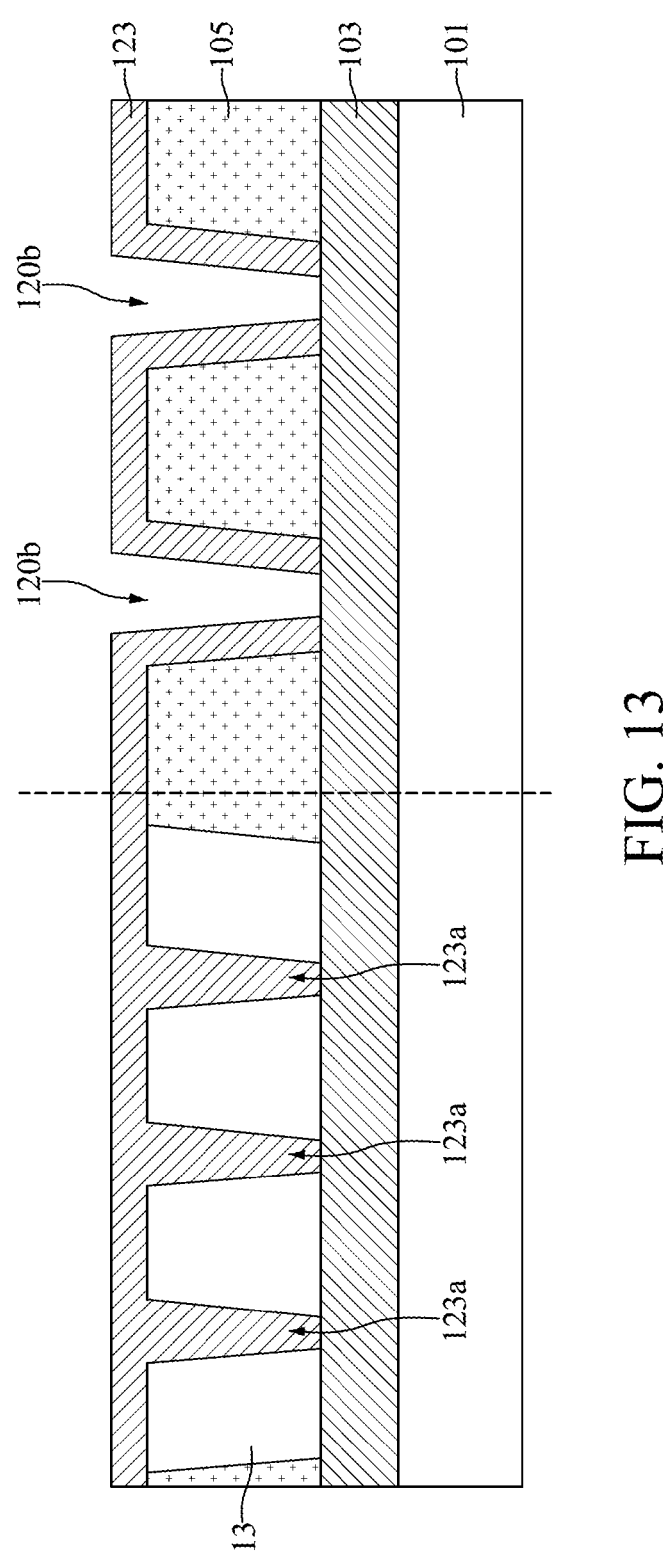
FIG. 13 is a cross-sectional view illustrating an intermediate stage of removing the patterned mask during the formation of the semiconductor device structure, in accordance with some embodiments.

After the first conductive layer 103 is partially exposed through the openings 120b in the pattern-loose region B, the patterned mask 125 is removed, as shown in FIG. 13 in accordance with some embodiments.

Figure 14:
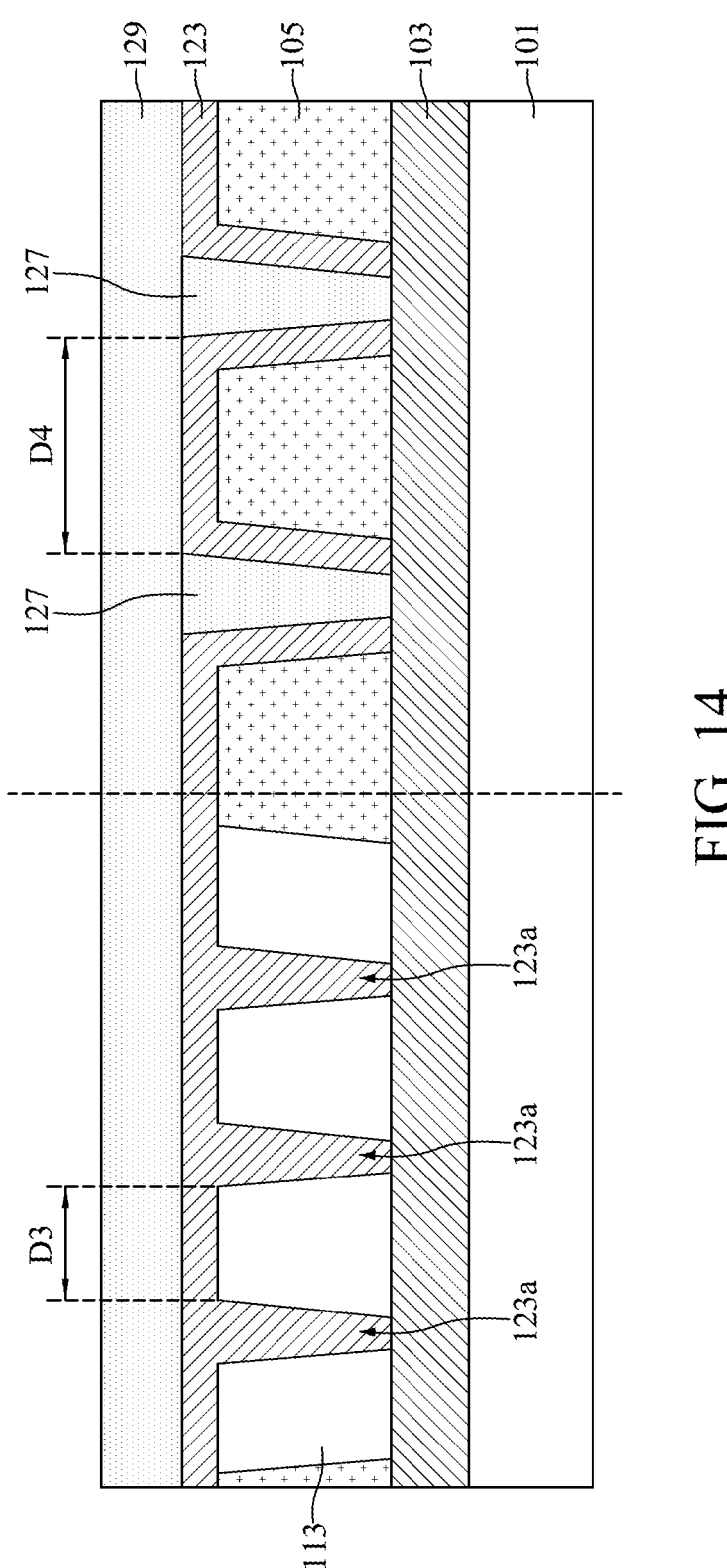
FIG. 14 is a cross-sectional view illustrating an intermediate stage of forming second conductive plugs and a second conductive layer during the formation of the semiconductor device structure, in accordance with some embodiments.

Next, the second conductive plugs 127 are formed in the openings 120*b* (see FIG. 13) in the pattern-loose region B, and the second conductive layer 129 is formed over the first lining layer 123 and the second conductive plugs 127, as shown in FIG. 14 in accordance with some embodiments. In some embodiments, the second conductive plugs 127 and the second conductive layer 129 are integrally formed. The respective steps are illustrated as the steps S23 and S25 in the method 10 shown in FIG. 2.

Specifically, in some embodiments, the second conductive plugs 127 and the second conductive layer 129 are formed simultaneously in same process steps, such as a deposition process and a subsequent planarizing process. The deposition process may be a CVD process, a PVD process, an ALD process, a MOCVD process, a sputtering process, a plating process, or another applicable process. The planarizing process may include a CMP process, an etch-back process, or another applicable process. In addition, in some embodiments, the second conductive plugs 127 and the second conductive layer 129 are made of (or include) copper (Cu).

Additionally, in some embodiments, each adjacent pair of the first conductive plugs 123*a* in the pattern-dense region A has a distance D3 therebetween, and each adjacent pair of the second conductive plugs 127 in the pattern-loose region B has a distance D4 therebetween, wherein the distance D4 is greater than the distance D3.

Figure 15:
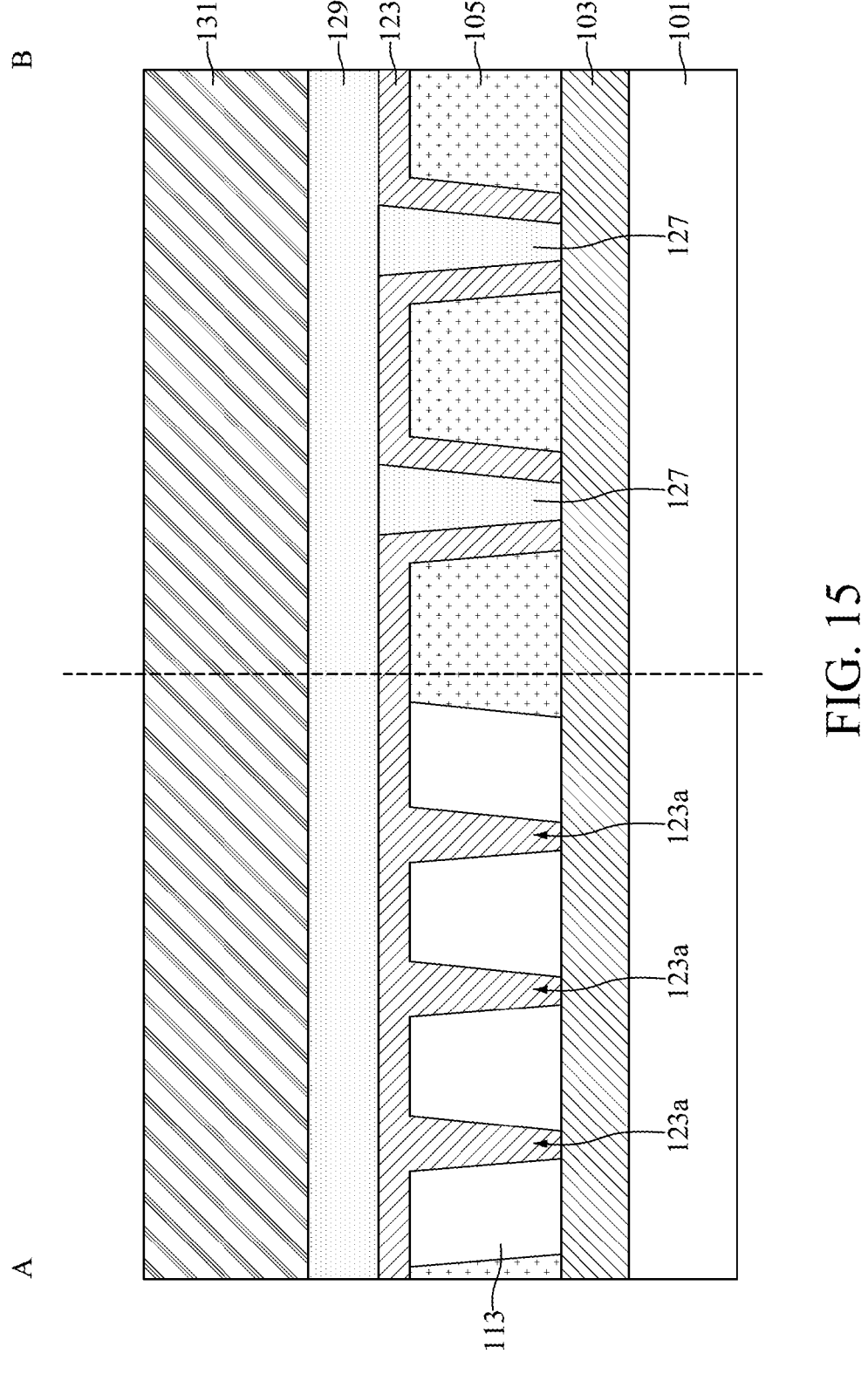
FIG. 15 is a cross-sectional view illustrating an intermediate stage of forming a second dielectric layer over the second conductive layer during the formation of the semiconductor device structure, in accordance with some embodiments.

Subsequently, the second dielectric layer 131 is formed over the second conductive layer 129, as shown in FIG. 15 in accordance with some embodiments. Some materials and processes used to form the second dielectric layer 131 are similar to, or same as, those used to form the first dielectric layer 105, and details thereof are not repeated herein.

Figure 16:
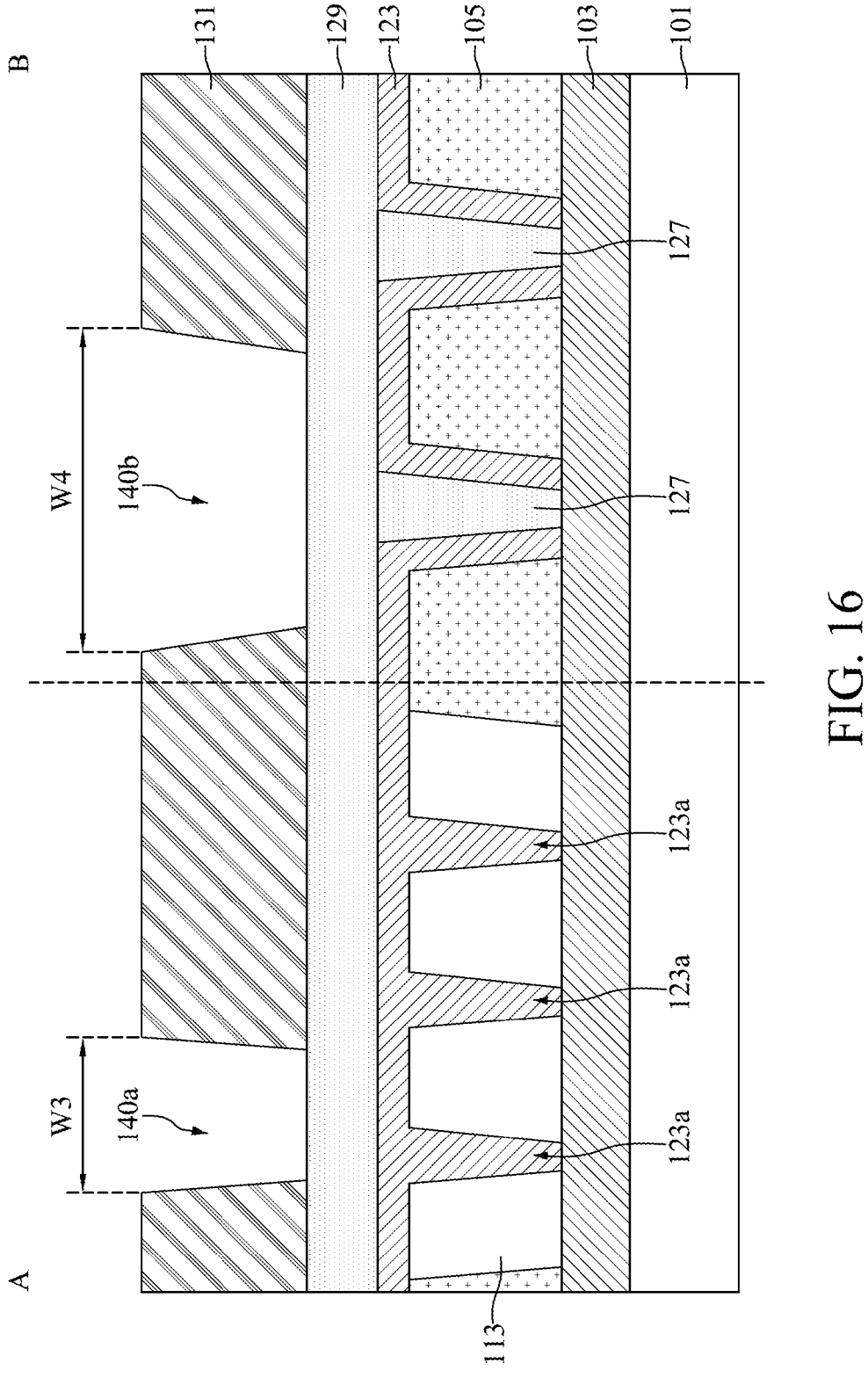
FIG. 16 is a cross-sectional view illustrating an intermediate stage of etching the second dielectric layer during the formation of the semiconductor device structure, in accordance with some embodiments.

Next, the second dielectric layer 131 is etched to form an opening 140*a* in the pattern-dense region A and an opening 140*b* in the pattern-loose region B, as shown in FIG. 16 in accordance with some embodiments. In some embodiments, each of the openings 140*a* and 140*b* exposes a portion of the second conductive layer 129. An etching process for forming the openings 140*a* and 140*b* may be a wet-etching process, a dry-etching process, or a combination thereof. In some embodiments, the opening 140*a* has a width W3, and the opening 140*b* has a width W4, wherein the width W4 is greater than the width W3. In some embodiments, the widths W3 and W4 are defined as topmost widths of the openings 140*a* and 140*b*, respectively.

Figure 17:
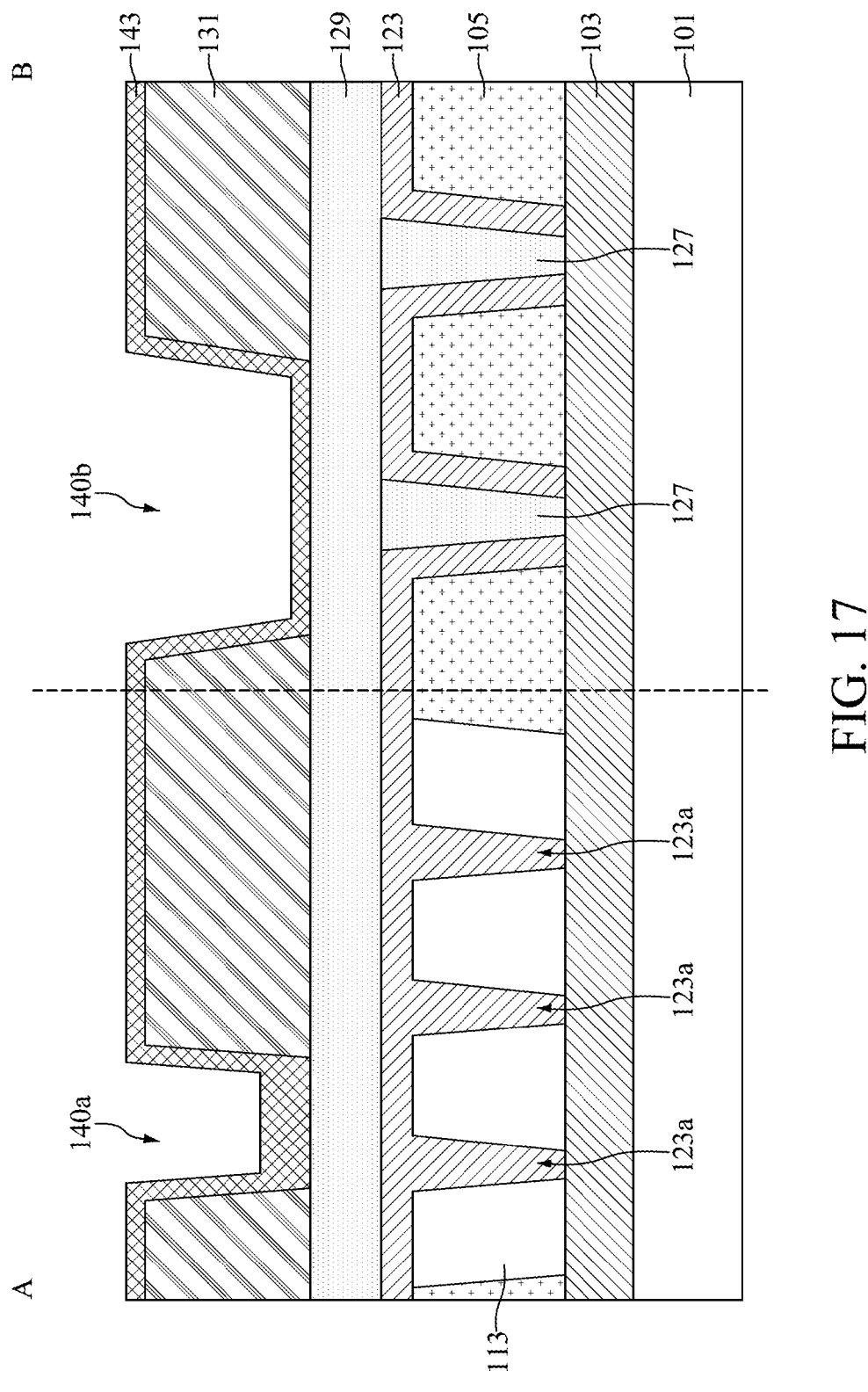
FIG. 17 is a cross-sectional view illustrating an intermediate stage of forming a second lining layer during the formation of the semiconductor device structure, in accordance with some embodiments.

After the openings 140*a* and 140*b* are formed, the second lining layer 143 is conformally deposited over the dielectric layer 131 and covers sidewalls and bottom surfaces of the openings 140*a* and 140*b*, as shown in FIG. 17 in accordance with some embodiments. In some embodiments, the second lining layer 143 is made of (or includes) manganese-rich manganese silicon (MnSi) or manganese (Mn). The second lining layer 143 may be formed by a deposition process, such as CVD, PVD, ALD, MOCVD, sputtering or plating.

Figure 18:
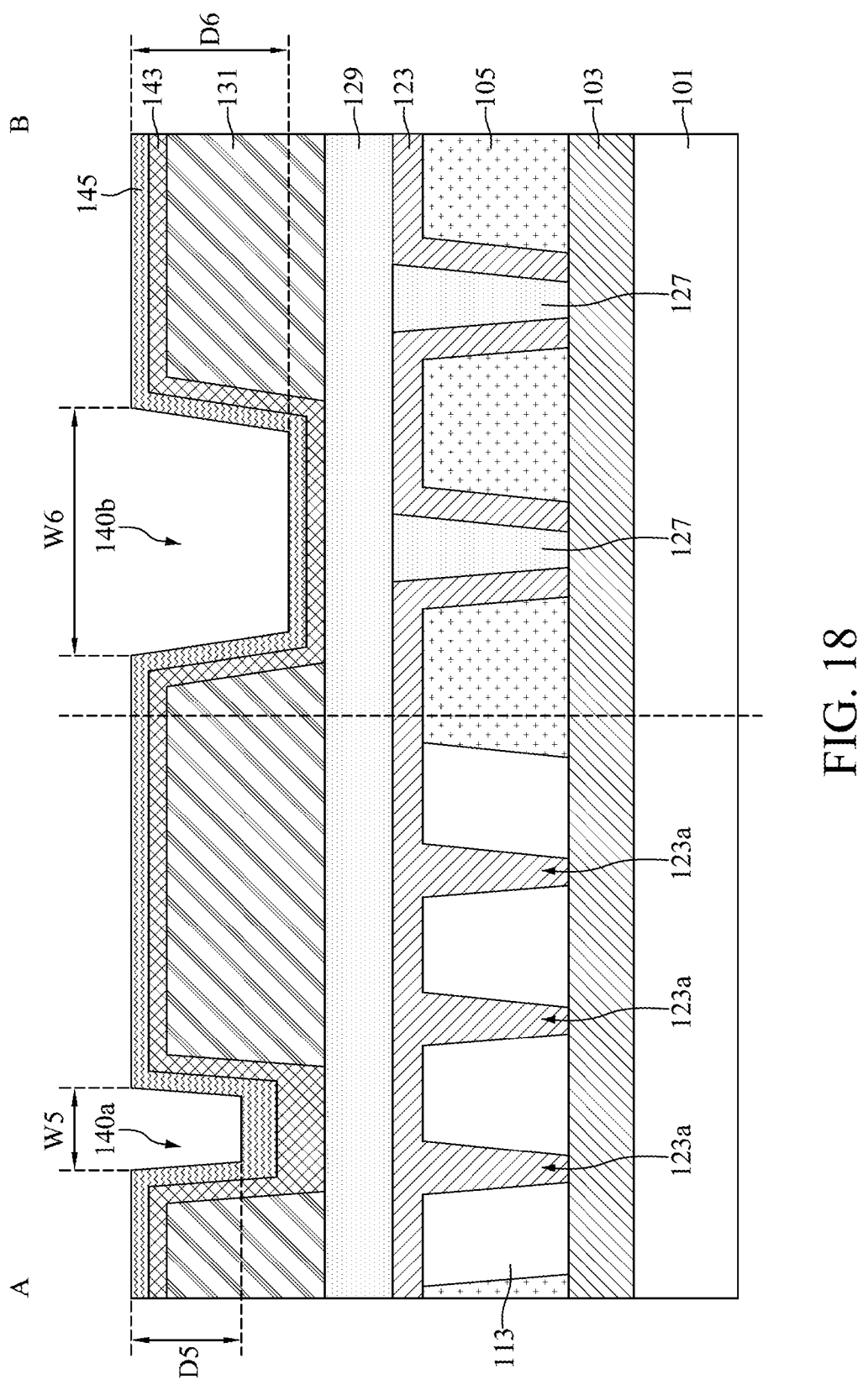
FIG. 18 is a cross-sectional view illustrating an intermediate stage of forming a third lining layer during the formation of the semiconductor device structure, in accordance with some embodiments.

Next, the third lining layer 145 is conformally deposited over the second lining layer 143, as shown in FIG. 18 in accordance with some embodiments. In some embodiments, the third lining layer 145 is made of (or includes) copper manganese (CuMn). Some processes used to form the third lining layer 145 are similar to, or same as, those used to form the second lining layer 143, and details thereof are not repeated herein.

Subsequently, the first conductive structure 147*a* is formed in a remaining portion of the opening 140*a*, the second conductive structure 147*b* is formed in a remaining portion of the opening 140*b*, and the third conductive layer

149 is formed over the third lining layer 145, the first conductive structure 147*a* and the second conductive structure 147*b*, as shown in FIG. 19 in accordance with some embodiments. In some embodiments, the first conductive structure 147*a*, the second conductive structure 147*b*, and the third conductive layer 149 are integrally formed.

Specifically, the first conductive structure 147*a*, the second conductive structure 147*b* and the third conductive layer 149 are formed simultaneously in same process steps, such as a deposition process and a subsequent planarizing process. The deposition process may be a CVD process, a PVD process, an ALD process, a MOCVD process, a sputtering process, a plating process, or another applicable process. The planarizing process may include a CMP process, an etch-back process, or another applicable process. In addition, in some embodiments, the first conductive structure 147*a*, the second conductive structure 147*b* and the third conductive layer 149 are made of (or include) copper (Cu).

In some embodiments, the opening 140*b* in the pattern-loose region B is wider than the opening 140*a* in the pattern-dense region A (as shown in FIG. 16, the width W4 is greater than the width W3). Therefore, after the third lining layer 145 is formed, the width W6 of the remaining portion of the opening 140*b* is greater than the width W5 of the remaining portion of the opening 140*a*, and a depth D6 of the remaining portion of the opening 140*b* is greater than a depth D5 of the remaining portion of the opening 140*a*. As a result, the width W6 of the second conductive structure 147*b* is greater than the width W5 of the first conductive structure 147*a*, and a height H2 of the second conductive structure 147*b* is greater than a height H1 of the first conductive structure 147*a*, as shown in FIG. 19 in accordance with some embodiments.

Referring to FIG. 20, a heat treatment process is performed to transform the energy-removable layer 113 into the air gaps 160 and the energy-removable structures 113' surrounding the air gaps 160, in accordance with some embodiments. The energy-removable structures 113' are remaining portions of the energy-removable layer 113 after the heat treatment process. In some embodiments, the air gaps 160 are enclosed by the energy-removable structures 113'. The respective step is illustrated as the step S27 in the method 10 shown in FIG. 2.

In some embodiments, the heat treatment process can be replaced by a light treatment process, an e-beam treatment process, a combination thereof, or another applicable energy treatment process. After the air gaps 160 are formed, the semiconductor device structure 200 is obtained.

Figure 21:
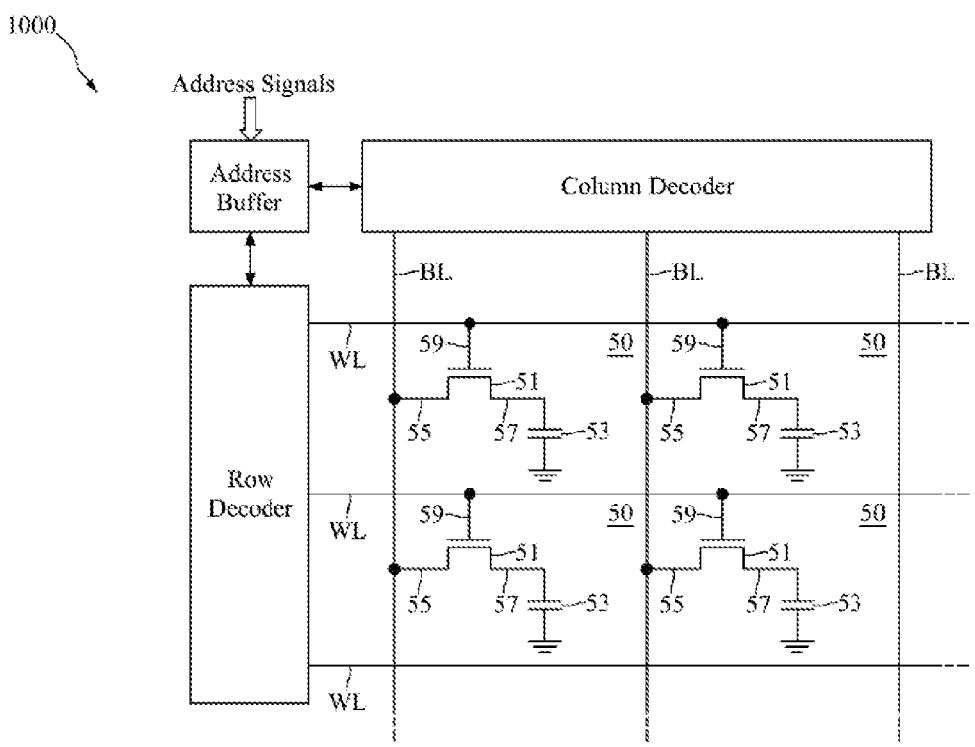
FIG. 21 is a partial schematic illustration of an exemplary integrated circuit, including an array of memory cells in accordance with some embodiments.

FIG. 21 is a partial schematic illustration of an exemplary integrated circuit, such as a memory device 1000, including an array of memory cells 50 in accordance with some embodiments. In some embodiments, the memory device 1000 includes a DRAM. In some embodiments, the memory device 1000 includes a number of memory cells 50 arranged in a grid pattern and including a number of rows and columns. The number of memory cells 50 may vary depending on system requirements and fabrication technology.

In some embodiments, each of the memory cells 50 includes an access device and a storage device. The access device is configured to provide controlled access to the storage device. In particular, the access device is a field-effect transistor (FET) 51 and the storage device is a capacitor 53, in accordance with some embodiments. In each of the memory cells 50, the FET 51 includes a drain 55, a source 57 and a gate 59. One terminal of the capacitor 53 is electrically connected to the source 57 of the FET 51, and another terminal of the capacitor 53 may be electrically connected to ground. In addition, in each of the memory cells 50, the gate 59 of the FET 51 is electrically connected to a word line WL, and the drain 55 of the FET 51 is electrically connected to a bit line BL.

The above description mentions that a terminal of the FET 51 electrically connected to the capacitor 53 is the source 57, and a terminal of the FET 51 electrically connected to the bit line BL is the drain 55. However, during read and write operations, the terminal of the FET 51 electrically connected to the capacitor 53 may be the drain, and the terminal of the FET 51 electrically connected to the bit line BL may be the source. That is, either terminal of the FET 51 could be a source or a drain depending on a manner in which the FET 51 is being controlled by voltages applied to the source, the drain and the gate.

By controlling the voltage at the gate 59 via the word line WL, a voltage potential may be created across the FET 51 such that the electrical charge can flow from the drain 55 to the capacitor 53. Therefore, the electrical charge stored in the capacitor 53 may be interpreted as a binary data value in the memory cell 50. For example, a positive charge above a threshold voltage stored in the capacitor 53 may be interpreted as binary "1." If the charge in the capacitor 53 is below the threshold value, a binary value of "0" is said to be stored in the memory cell 50.

The bit lines BL are configured to read and write data to and from the memory cells 50. The word lines WL are configured to activate the FET 51 to access a particular row of the memory cells 50. Accordingly, the memory device 1000 also includes a periphery circuit region which may include an address buffer, a row decoder and a column decoder. The row decoder and the column decoder selectively access the memory cells 50 in response to address signals that are provided to the address buffer during read, write and refresh operations. The address signals are typically provided by an external controller such as a microprocessor or another type of memory controller.

Referring back to FIG. 20, the first conductive plugs 123a (i.e., the manganese-containing conductive plugs) are formed in the pattern-dense region A, while the second conductive plugs 127 (i.e., the copper-containing conductive plugs) are formed in the pattern-loose region B. The pattern-dense region A may be any of the regions of the memory cells 50 in the memory device 1000, and the pattern-loose region B may be any of the regions of the address buffer, the row decoder, or the column decoder in the memory device 1000.

Embodiments of the semiconductor device structure 100/200 and method for preparing the same are provided in the disclosure. In some embodiments, the semiconductor device structure 200 includes the first conductive plugs 123a penetrating through the first dielectric layer 105 in the pattern-dense region A, the first lining layer 123 covering the first dielectric layer 105 and the first conductive plugs 123a, and the second conductive plugs 127 penetrating through the lining layer 123 and the first dielectric layer 105 in the pattern-loose region B. The first lining layer 123 and the first conductive plugs 123a include manganese, and the second conductive plugs 127 are separated from the first dielectric layer 105 by the first lining layer 123. The manganese-containing conductive plugs (i.e., the first conductive plugs 123a in the pattern-dense region A) and the first lining layer 123 may be integrally formed, thereby reducing manufacturing cost. Moreover, the first lining layer 123 may reduce or prevent voids from forming in the subsequently-formed conductive plugs (i.e., the second conductive plugs 127 in the pattern-loose region B), thereby decreasing contact resistance. As a result, an operation speed of the semiconductor device structure 200 may be increased, which significantly improves overall device performance.

Since the second pattern 1152 is not formed by photolithographic techniques, the second critical dimension CD2 is not constrained by the limit of the techniques in use. For example, in an embodiment described above, the second pattern 1152 is formed by thermal oxidation so that the oxidation layer of the sidewall 1154 of the first pattern 1151 can be easily controlled to reduce the first critical dimension CD1 of the first pattern 1151 to the second critical dimension CD2 of the second pattern 1152 since thermal oxidation is well-known by people having ordinary skill in the art. Thus, a smaller critical dimension may be achieved without employing new (and possibly faulty and costly) photolithographic techniques.

In one embodiment of the present disclosure, a semiconductor device is provided. The semiconductor device includes a first conductive layer disposed over a semiconductor substrate; a first dielectric layer disposed over the first conductive layer; an energy-removable layer conformally deposited over the first dielectric layer in a pattern-dense region, wherein a top surface of the energy-removable layer is substantially coplanar with a top surface of the first dielectric layer; a patterned mask disposed over the first dielectric layer and the energy-removable layer, wherein the patterned mask includes a first pattern, a second pattern, and a third pattern, the first pattern is disposed in the pattern-dense region, the second pattern is disposed over a sidewall of the first pattern, and the third pattern is disposed in a pattern-loose region; and a plurality of processed areas disposed on the top surface of the energy-removable layer and between two adjacent first patterns and also disposed on a pattern top surface of the first pattern.

In another embodiment of the present disclosure, a semiconductor device structure is provided. The semiconductor device structure includes a first conductive layer disposed over a semiconductor substrate; an energy-removable layer disposed over the first conductive layer; a plurality of first patterns individually disposed over the energy-removable layer; a plurality of second patterns disposed over sidewalls of each of the first patterns; and a plurality of processed areas disposed on a top surface of the energy-removable layer and between two adjacent first patterns and also disposed on a pattern top surface of each of the first patterns.

In yet another embodiment of the present disclosure, a method for preparing a semiconductor device is provided. The method includes forming a first conductive layer over a semiconductor substrate; forming a first dielectric layer over the first conductive layer; replacing a portion of the first dielectric layer with an energy-removable layer; forming a first pattern over the energy-removable layer, wherein the first pattern has a first critical dimension; forming a plurality of processed areas on a pattern top surface of the first pattern and on a portion of a top surface of the energy-removable layer that is exposed through the first pattern; and forming a second pattern on sidewalls of the first pattern outside of the processed areas, wherein the second pattern has a second critical dimension and the second critical dimension is smaller than the first critical dimension.

The embodiments of the present disclosure have some advantageous features. The pattern top surface and the top surface exposed through the first pattern are processed (e.g., damaged by ion implantation) so that the second pattern is selectively formed only on the sidewalls of the first pattern, excluding the processed areas. Thus, the second pattern reduces the gaps between the features of the first pattern.

That is, the first pattern and the second pattern combine to form a new pattern with a smaller gap. The resulting combined pattern of the semiconductor structure therefore has a critical dimension smaller than that of the original first pattern. That is, the second pattern 1152 is disposed on the sidewall 1154 of the first pattern 1151 and reduces the gaps between the features of the first pattern 1151, which results in the smaller second critical dimension CD2 (CD2<CD1), i.e., the critical dimension (CD) is reduced.

In addition, by integrally forming the manganese-containing conductive plugs in the pattern-dense region and the manganese-containing lining layer, manufacturing cost may be reduced. In addition, resistance of the conductive plugs in the pattern-loose region surrounded by the manganese-containing lining layer may be decreased. As a result, the operation speed of the semiconductor device structure is increased, which significantly improves the overall device performance.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods, and steps.

What is claimed is:

1. A semiconductor device structure, comprising:
a first conductive layer disposed over a semiconductor substrate;
a first dielectric layer disposed over the first conductive layer, wherein the first dielectric layer has a pattern-dense region and a pattern-loose region;
an energy removable layer conformally deposited over the first dielectric layer in the pattern-dense region, wherein a top surface of the energy removable layer is substantially coplanar with a top surface of the first dielectric layer; a patterned mask disposed over the first dielectric layer and the energy removable layer, wherein the patterned mask includes a first mask pattern, a second mask pattern, and a third mask pattern, the first pattern is disposed in the pattern-dense region, the second pattern is disposed over a sidewall of the first pattern, and the third pattern is disposed in the pattern-loose region; and
a plurality of processed areas disposed on the top surface of the energy removable layer and between two adjacent first patterns and also disposed on a pattern top surface of the first pattern.

2. The semiconductor device structure of claim 1, wherein the first mask pattern has a first critical dimension and the second mask pattern has a second critical dimension, wherein the second critical dimension is smaller than the first critical dimension.

3. The semiconductor device structure of claim 1, wherein a material of the first mask pattern is silicon, which is either amorphous silicon or polysilicon.

4. The semiconductor device structure of claim 1, wherein a material of the second mask pattern is silicon oxide.

5. The semiconductor device structure of claim 1, wherein a material of the first mask pattern is same as a material of the third mask pattern.

6. The semiconductor device structure of claim 1, wherein the second mask pattern is formed by non-photolithographic techniques.

7. The semiconductor device structure of claim 1, wherein the second mask pattern is formed by thermal oxidation.

8. A semiconductor device structure, comprising:
a first conductive layer disposed over a semiconductor substrate;
an energy removable layer disposed over the first conductive layer;
a plurality of first patterns individually disposed over the energy removable layer;
a plurality of second patterns disposed over sidewalls of the plurality of first patterns; and
a plurality of processed areas disposed on a top surface of the energy removable layer and between two adjacent of the plurality of first patterns and also disposed on a pattern top surface of the plurality of first patterns;
wherein a material of each of the plurality of first patterns is silicon, which is either amorphous silicon or polysilicon.

9. The semiconductor device structure of claim 8, wherein each of the plurality of first patterns has a first critical dimension and each of the plurality of second patterns has a second critical dimension, wherein the second critical dimension is smaller than the first critical dimension.

10. The semiconductor device structure of claim 8, wherein a material of each of the plurality of second patterns is silicon oxide.

11. The semiconductor device structure of claim 8, wherein the plurality of second patterns are formed by non-photolithographic techniques.

12. The semiconductor device structure of claim 8, wherein the plurality of second patterns are formed by thermal oxidation.

* * * * *